United States Patent
Galvin

(10) Patent No.: US 12,166,507 B1
(45) Date of Patent: *Dec. 10, 2024

(54) SYSTEM AND METHOD FOR COMPRESSING AND RESTORING DATA USING MULTI-LEVEL AUTOENCODERS AND CORRELATION NETWORKS

(71) Applicant: AtomBeam Technologies Inc., Moraga, CA (US)

(72) Inventor: Brian Galvin, Silverdale, WA (US)

(73) Assignee: ATOMBEAM TECHNOLOGIES INC., Moraga, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/648,340

(22) Filed: Apr. 27, 2024

Related U.S. Application Data

(63) Continuation-in-part of application No. 18/427,716, filed on Jan. 30, 2024, which is a continuation-in-part of application No. 18/410,980, filed on Jan. 11, 2024, now Pat. No. 12,068,761, which is a continuation-in-part of application No. 18/537,728, filed on Dec. 12, 2023, now Pat. No. 12,058,333.

(51) Int. Cl.
  *H03M 7/34* (2006.01)
  *H03M 7/30* (2006.01)
  *H04N 19/42* (2014.01)

(52) U.S. Cl.
  CPC ............. *H03M 7/60* (2013.01); *H04N 19/42* (2014.11)

(58) Field of Classification Search
  CPC ............................ H03M 7/3062; H04N 19/80
  USPC ....................................................... 341/50, 51
  See application file for complete search history.

(56) References Cited

U.S. PATENT DOCUMENTS

| | | | |
|---|---|---|---|
| 7,629,922 B2 | 12/2009 | Winstead et al. | |
| 7,876,257 B2 | 1/2011 | Vetro et al. | |
| 11,656,353 B2 | 5/2023 | Li et al. | |
| 11,915,690 B1 | 2/2024 | Chang et al. | |
| 2020/0272605 A1* | 8/2020 | More | G06N 3/088 |
| 2020/0404340 A1 | 12/2020 | Xu et al. | |
| 2022/0246158 A1 | 8/2022 | Nam et al. | |

OTHER PUBLICATIONS

Cai, Yuanhao et al., "Mask-guided Spectral-wise Transformer for Efficient Hyperspectral Image Reconstruction", Conference on Computer Vision and Pattern Recognition, pp. 17502-17511, 2022.
Cai, Yuanhao; et al., "MST++: Multi-stage Spectral-wise Transformer for Efficient Spectral Reconstruction", Conference on Computer Vision and Pattern Recognition, 2022.
He, Kaiming; Zhang, Xiangyu; Ren, Shaoqing; Sun, Jian; Microsoft Research, "Deep Residual Learning for Image Recognition", Conference on Computer Vision and Pattern Recognition, pp. 770-778, 2016.

\* cited by examiner

*Primary Examiner* — Jean B Jeanglaude
(74) *Attorney, Agent, or Firm* — Galvin Patent Law LLC; Brian R. Galvin

(57) ABSTRACT

Compressing and restoring data using a multi-level autoencoder and a correlation network. The multi-level autoencoder compresses (in the encoder section) and decompresses (in the decoder section) data streams, and a separate correlation network trained on groups of input data sets restores lost data by leveraging correlations between the data sets.

10 Claims, 12 Drawing Sheets

SYSTEM AND METHOD FOR COMPRESSING AND RESTORING DATA USING MULTI-LEVEL AUTOENCODERS AND CORRELATION NETWORKS

CROSS-REFERENCE TO RELATED APPLICATIONS

Priority is claimed in the application data sheet to the following patents or patent applications, each of which is expressly incorporated herein by reference in its entirety:
Ser. No. 18/427,716
Ser. No. 18/410,980
Ser. No. 18/537,728

BACKGROUND OF THE INVENTION

Field of the Art

The present invention relates to the field of deep learning and data compression. More specifically, the invention pertains to systems and methods that utilize multi-layer autoencoder for data compression and restoration.

Discussion of the State of the Art

The In recent years, deep learning approaches have shown promising results in data compression and restoration. Autoencoders, a type of neural network architecture, have emerged as a powerful tool for learning compact representations of data. Autoencoders consist of an encoder network that maps input data to a lower-dimensional latent space and a decoder network that reconstructs the original data from the latent representation.

Multi-layer autoencoders, also known as stacked autoencoders or deep autoencoders, have been proposed to learn hierarchical representations of data. These architectures stack multiple layers of encoders and decoders, allowing for more complex and abstract feature learning. Multi-layer autoencoders have been successfully applied in various domains, such as image compression, video compression, and speech enhancement. However, existing multi-layer autoencoder architectures often focus solely on the compression aspect and do not fully exploit the correlations and patterns within the data. Correlations between different data samples or neighboring regions can provide valuable information for data restoration and enhancement.

To address this limitation, correlation-based methods have been explored in the context of data restoration. These methods leverage the correlations and similarities between data samples to predict missing or corrupted information. For example, non-local means filtering and block-matching and 3D filtering (BM3D) have been widely used for image denoising by exploiting self-similarities within an image.

What is needed is an efficient and effective system and method that combine the benefits of multi-layer autoencoders and correlation-based techniques for data compression and restoration. Such an architecture should be capable of learning hierarchical representations, exploiting correlations within the data, and achieving high compression ratios while preserving important information. The present invention addresses these challenges by introducing a multi-layer autoencoder with a correlation layer. The proposed architecture leverages the power of deep learning to learn compact representations of data while explicitly modeling and utilizing correlations for enhanced data restoration. By incorporating a correlation layer within the autoencoder framework, the invention aims to achieve state-of-the-art performance in data compression and restoration tasks.

SUMMARY OF THE INVENTION

Accordingly, the inventor has conceived and reduced to practice, a system and method for compressing and restoring data using multi-level autoencoders and correlation networks. The invention comprises two main components: a multi-level autoencoder for compression and a correlation network for restoration. The multi-level autoencoder consists of an encoder and a decoder. The encoder compresses an input image into a compact representation, while the decoder reconstructs the image from the compressed representation. The architecture of the autoencoder can include convolutional layers, pooling layers, and activation functions. The correlation network may be trained on sets of compressed data sets to learn correlations between them. It takes the compressed representations as input and outputs restored versions of the images. The architecture of the correlation network may include convolutional layers and activation functions. During training, the autoencoder and correlation network may be optimized jointly using loss functions that measure the reconstruction quality and the restoration quality, respectively. The training process may involve forward passes through both networks, calculating losses, and updating the network parameters using optimization algorithms.

According to a preferred embodiment, a system for compressing and restoring data, comprising: a computing device comprising at least a memory and a processor; a plurality of programming instructions stored in the memory and operable on the processor, wherein the first plurality of programming instructions, when operating on the processor, cause the computing device to: preprocess a plurality of data sets; compress the plurality of data sets into a compressed plurality of data sets using an encoder within a multi-layer autoencoder; decompress the compressed plurality of data sets using a decoder located within a multi-layer autoencoder; recover lost information by leveraging patterns and similarities between the decompressed plurality of data sets using a correlation network; and create a restored, more reconstructed version of the plurality of data sets where the reconstructed version of the plurality of data sets includes recovered lost information, is disclosed.

According to another preferred embodiment, a method for compressing and restoring data, comprising the steps of: preprocessing a plurality of data sets; compressing the plurality of data sets into a compressed plurality of data sets using an encoder within a multi-layer autoencoder; decompressing the compressed plurality of data sets using a decoder located within a multi-layer autoencoder; recovering lost information by leveraging patterns and similarities between the decompressed plurality of data sets using a correlation network; and creating a restored, more reconstructed version of the plurality of data sets where the reconstructed version of the plurality of data sets includes recovered lost information, is disclosed.

According to an aspect of an embodiment, the multi-level autoencoder comprises an encoder and a decoder, and the encoder includes convolutional layers, pooling layers, and activation functions.

According to an aspect of an embodiment, the correlation network comprises convolutional layers and activation functions.

According to an aspect of an embodiment, the plurality of data sets include a plurality of IoT sensor data where the incoming IoT sensor data is organized by origin sensor type prior to preprocessing.

According to an aspect of an embodiment, the plurality of data sets include hyperspectral data.

BRIEF DESCRIPTION OF THE DRAWING FIGURES

DETAILED DESCRIPTION OF THE INVENTION

Figure 1:
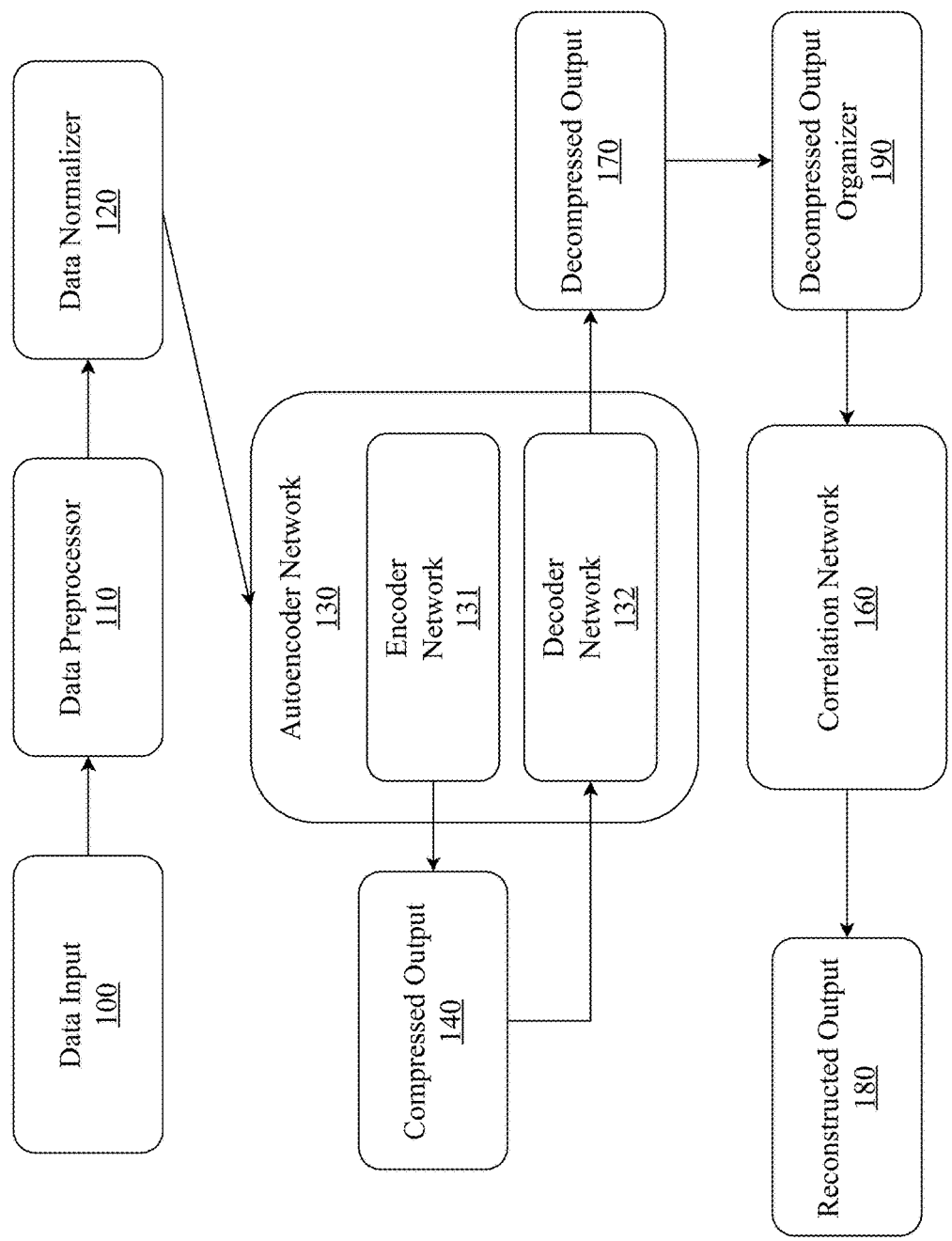
FIG. 1 is a block diagram illustrating an exemplary system architecture for compressing and restoring data using multi-level autoencoders and correlation networks.

The inventor has conceived, and reduced to practice, a system and method for AI-enabled telematics for electronic entertainment and simulation systems.

One or more different aspects may be described in the present application. Further, for one or more of the aspects described herein, numerous alternative arrangements may be described; it should be appreciated that these are presented for illustrative purposes only and are not limiting of the aspects contained herein or the claims presented herein in any way. One or more of the arrangements may be widely applicable to numerous aspects, as may be readily apparent from the disclosure. In general, arrangements are described in sufficient detail to enable those skilled in the art to practice one or more of the aspects, and it should be appreciated that other arrangements may be utilized and that structural, logical, software, electrical and other changes may be made without departing from the scope of the particular aspects. Particular features of one or more of the aspects described herein may be described with reference to one or more particular aspects or figures that form a part of the present disclosure, and in which are shown, by way of illustration, specific arrangements of one or more of the aspects. It should be appreciated, however, that such features are not limited to usage in the one or more particular aspects or figures with reference to which they are described. The present disclosure is neither a literal description of all arrangements of one or more of the aspects nor a listing of features of one or more of the aspects that must be present in all arrangements.

Headings of sections provided in this patent application and the title of this patent application are for convenience only, and are not to be taken as limiting the disclosure in any way.

Devices that are in communication with each other need not be in continuous communication with each other, unless expressly specified otherwise. In addition, devices that are in communication with each other may communicate directly or indirectly through one or more communication means or intermediaries, logical or physical.

A description of an aspect with several components in communication with each other does not imply that all such components are required. To the contrary, a variety of optional components may be described to illustrate a wide variety of possible aspects and in order to more fully illustrate one or more aspects. Similarly, although process steps, method steps, algorithms or the like may be described in a sequential order, such processes, methods and algorithms may generally be configured to work in alternate orders, unless specifically stated to the contrary. In other words, any sequence or order of steps that may be described in this patent application does not, in and of itself, indicate a requirement that the steps be performed in that order. The steps of described processes may be performed in any order practical. Further, some steps may be performed simultaneously despite being described or implied as occurring non-simultaneously (e.g., because one step is described after the other step). Moreover, the illustration of a process by its depiction in a drawing does not imply that the illustrated process is exclusive of other variations and modifications thereto, does not imply that the illustrated process or any of its steps are necessary to one or more of the aspects, and does not imply that the illustrated process is preferred. Also, steps are generally described once per aspect, but this does not mean they must occur once, or that they may only occur once each time a process, method, or algorithm is carried out or executed. Some steps may be omitted in some aspects or some occurrences, or some steps may be executed more than once in a given aspect or occurrence.

When a single device or article is described herein, it will be readily apparent that more than one device or article may be used in place of a single device or article. Similarly, where more than one device or article is described herein, it will be readily apparent that a single device or article may be used in place of the more than one device or article. The functionality or the features of a device may be alternatively embodied by one or more other devices that are not explicitly described as having such functionality or features. Thus, other aspects need not include the device itself.

Techniques and mechanisms described or referenced herein will sometimes be described in singular form for clarity. However, it should be appreciated that particular aspects may include multiple iterations of a technique or multiple instantiations of a mechanism unless noted otherwise.

Process descriptions or blocks in figures should be understood as representing modules, segments, or portions of code which include one or more executable instructions for implementing specific logical functions or steps in the process. Alternate implementations are included within the scope of various aspects in which, for example, functions may be executed out of order from that shown or discussed, including substantially concurrently or in reverse order, depending on the functionality involved, as would be understood by those having ordinary skill in the art.

Conceptual Architecture

FIG. 1 is a block diagram illustrating an exemplary system architecture for compressing and restoring data using multi-level autoencoders and correlation networks. In one embodiment, a system for compressing and restoring data using multi-level autoencoders and correlation networks comprises a plurality of data inputs 100, a data preprocessor 110, a data normalizer 120, a multi-layer autoencoder network 130 which further comprises an encoder network 131 and a decoder network 132, a plurality of compressed outputs 140, plurality of decompressed outputs 170, a decompressed output organizer 190, a plurality of correlation networks 160, and a reconstructed output 180. The plurality of data inputs 100 are representations of raw data from various sources, such as sensors, cameras, or databases. The raw data can be in different formats, including but not limited to images, videos, audio, or structured data. The plurality of data inputs 100 may be transferred to the data preprocessor 110 for further processing. The data preprocessor 110 applies various preprocessing techniques to the raw data received from the data input 100. These techniques may include data cleaning, noise reduction, artifact removal, or format conversion. The preprocessor 110 ensures that the data is in a suitable format and quality for subsequent stages of the system.

The preprocessed data may then be passed to the data normalizer 120. The data normalizer 120 scales and normalizes the data to a consistent range, typically between 0 and 1. Normalization helps to improve the training stability and convergence of the autoencoder network 130. The normalized data is fed into the autoencoder network 130, which includes both the encoder network 131 and the decoder network 132. The encoder network 131 is responsible for encoding the input data into a lower-dimensional latent space representation. It consists of multiple layers of encoders that progressively reduce the dimensionality of the data while capturing the most important features and patterns.

The compressed latent representation obtained from the encoder network 131 is the compressed output 140. The compressed output 140 has a significantly reduced size compared to the original input data, enabling efficient storage and transmission. The compressed output 140 may be stored in a storage system. A storage system may be any suitable storage medium, such as a database, file system, or cloud storage. Storage systems allow for the efficient management and retrieval or the compressed data as needed. When the compressed data needs to be restored or reconstructed, it may be retrieved from the storage system and passed to the decoder network 132. Additionally, the compressed data may be directly passed to either the decompression network 132. The decoder network 132 is responsible for decoding the compressed latent representation back into the original data space by outputting a decompressed output 170. It consists of multiple layers of decoders that progressively increase the dimensionality of the data, reconstructing the original input.

The decompressed output 170 from the encoder network 132 may have some loss of information compared to the original input data due to the compression process. To further enhance the quality of the decompressed output, the system may incorporate a correlation network 160. The correlation network 160 leverages the correlations and patterns between different compressed inputs to restore the decompressed output more accurately. It learns to capture the relationships and dependencies within the data, allowing for better reconstruction and restoration of the original information. The correlation network 160 takes the decompressed outputs 170 as inputs. It analyzes the correlations and similarities between the data samples and uses this information to refine and enhance the decompressed output. The refined decompressed output from the correlation network 160 is a reconstructed output 180 of the system. The reconstructed output 180 closely resembles the original input data, with minimal loss of information and improved quality compared to the output from the decoder network 132 alone.

In one embodiment, the correlation network 160 may receive inputs from a decompressed output organizer 190 which that operates on the decompressed outputs 170 obtained from the decoder network 132. The decompressed output organizer 190 may organize the decompressed outputs 170 into groups based on their correlations and similarities.

By grouping decompressed outputs 170 based on similarities, the correlation network 160 will more easily be able to identify correlations between decompressed outputs 170. The correlation network 160 finds patterns and similarities between decompressed outputs 170 to develop a more holistic reconstructed original input. By priming the correlation network 160 with already grouped, similar compressed outputs 170, the correlation network 160 will be able to generate even more reliable reconstructions. The multi-layer autoencoder network 130 and the correlation network 160 are trained using a large dataset of diverse samples. The training process involves minimizing the reconstruction loss between the original input data and the decompressed output 170. The system learns to compress the data efficiently while preserving the essential features and patterns. An example of PyTorch pseudocode for a multi-layer autoencoder which utilizes a correlation network may be found in APPENDIX A.

Figure 2:
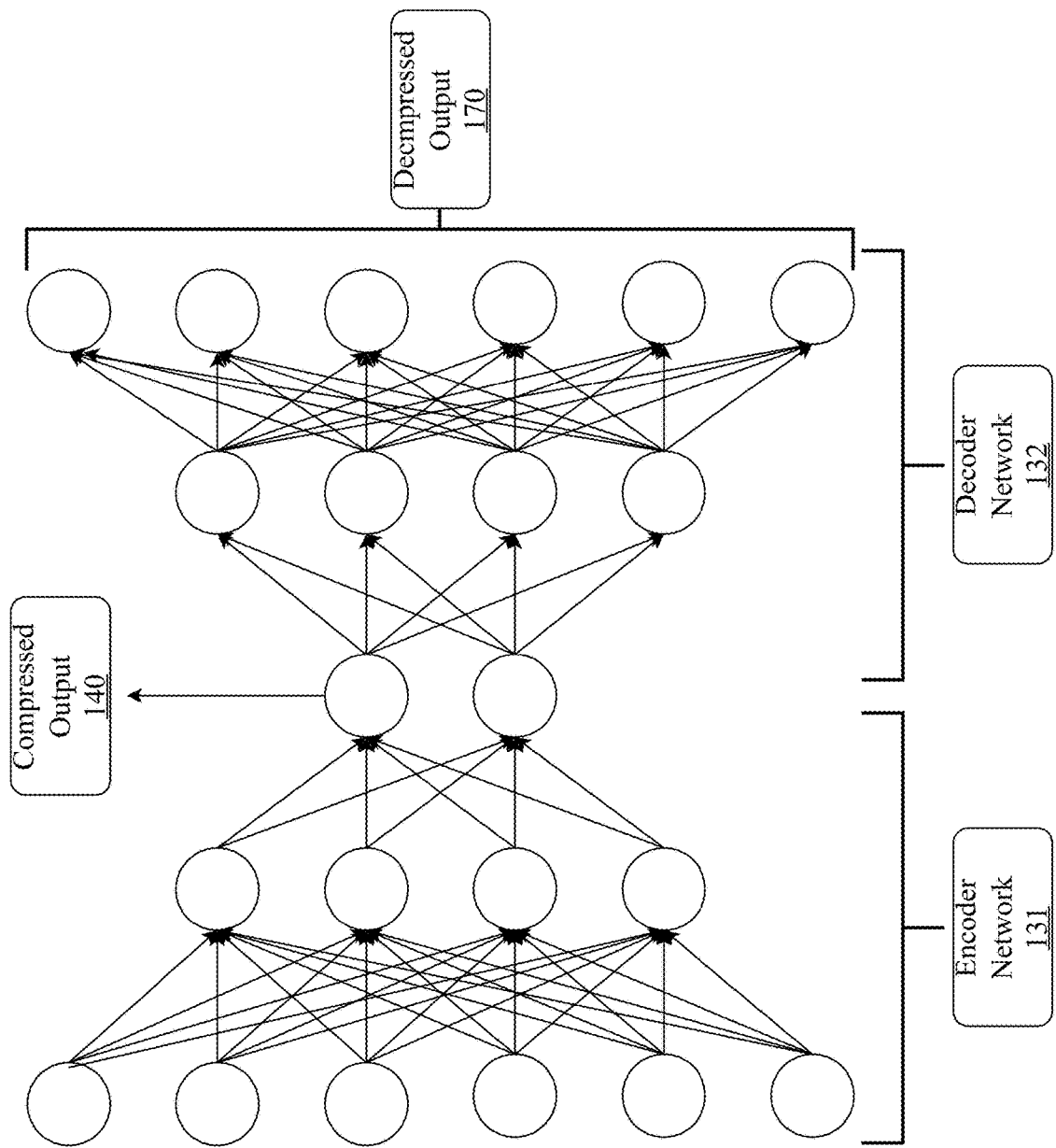
FIG. 2 is a block diagram illustrating an exemplary architecture for a subsystem of the system for compressing and restoring data using multi-level autoencoders and correlation networks, an autoencoder network.

FIG. 2 is a block diagram illustrating an exemplary architecture for a subsystem of the system for compressing and restoring data using multi-level autoencoders and correlation networks, a multi-layer autoencoder network. The multi-layer autoencoder network comprises an encoder network 131 or a decoder network 132 that work together to encode and decode data effectively. The encoder network 131 and decoder network 132 within the multi-layer autoencoder network 210 is comprised of a plurality of layers that contribute to the encoding and decoding process. These layers include, but are not limited to, convolutional layers, pooling layers, and a bottleneck layer. Some embodiments also include functions that operate on information including but not limited to rectified linear unit functions, sigmoid functions, and skip connections.

The convolutional layers are responsible for extracting meaningful features from the input data. They apply convolutional operations using learnable filters to capture spatial patterns and hierarchical representations of the data. The convolutional layers can have different numbers of filters, kernel sizes, and strides to capture features at various scales and resolutions. Skip connections are employed to facilitate the flow of information across different layers of the autoencoder. Skip connections allow the output of a layer to be directly added to the output of a subsequent layer, enabling the network to learn residual mappings and mitigate the vanishing gradient problem. Skip connections help in preserving fine-grained details and improving the training stability of the autoencoder.

Pooling layers are used to downsample the feature maps generated by the convolutional layers. They reduce the spatial dimensions of the feature maps while retaining the most salient information. Common pooling operations include but are not limited to max pooling and average pooling. Pooling layers help in achieving translation invariance, reducing computational complexity, and controlling the receptive field of the autoencoder. Rectified Linear Unit (ReLU) functions introduce non-linearity into the autoencoder by applying a ReLU activation function element-wise to the output of the previous layer. ReLU functions help in capturing complex patterns and relationships in the data by allowing the network to learn non-linear transformations. They also promote sparsity and alleviate the vanishing gradient problem. The bottleneck layer represents the most compressed representation of the input data. The bottleneck layer has a significantly reduced dimensionality compared to the input and output layers of the autoencoder. It forces the network to learn a compact and meaningful encoding of the data, capturing the essential features and discarding redundant information. In one embodiment, the multi-layer autoencoder network is comprised of a plurality of the previously mentioned layers where the sequence and composition of the layers may vary depending on a user's preferences and goals. The bottleneck layer is where the compressed output 140 is created. Each layer previous to the bottleneck layer creates a more and more compressed version of the original input. The layers after the bottleneck layer represent the decoder network 132 where a plurality of layers operate on a compressed input to decompress a data set. Decompression results in a version of the original input which is largely similar but has some lost data from the transformations.

Figure 3:
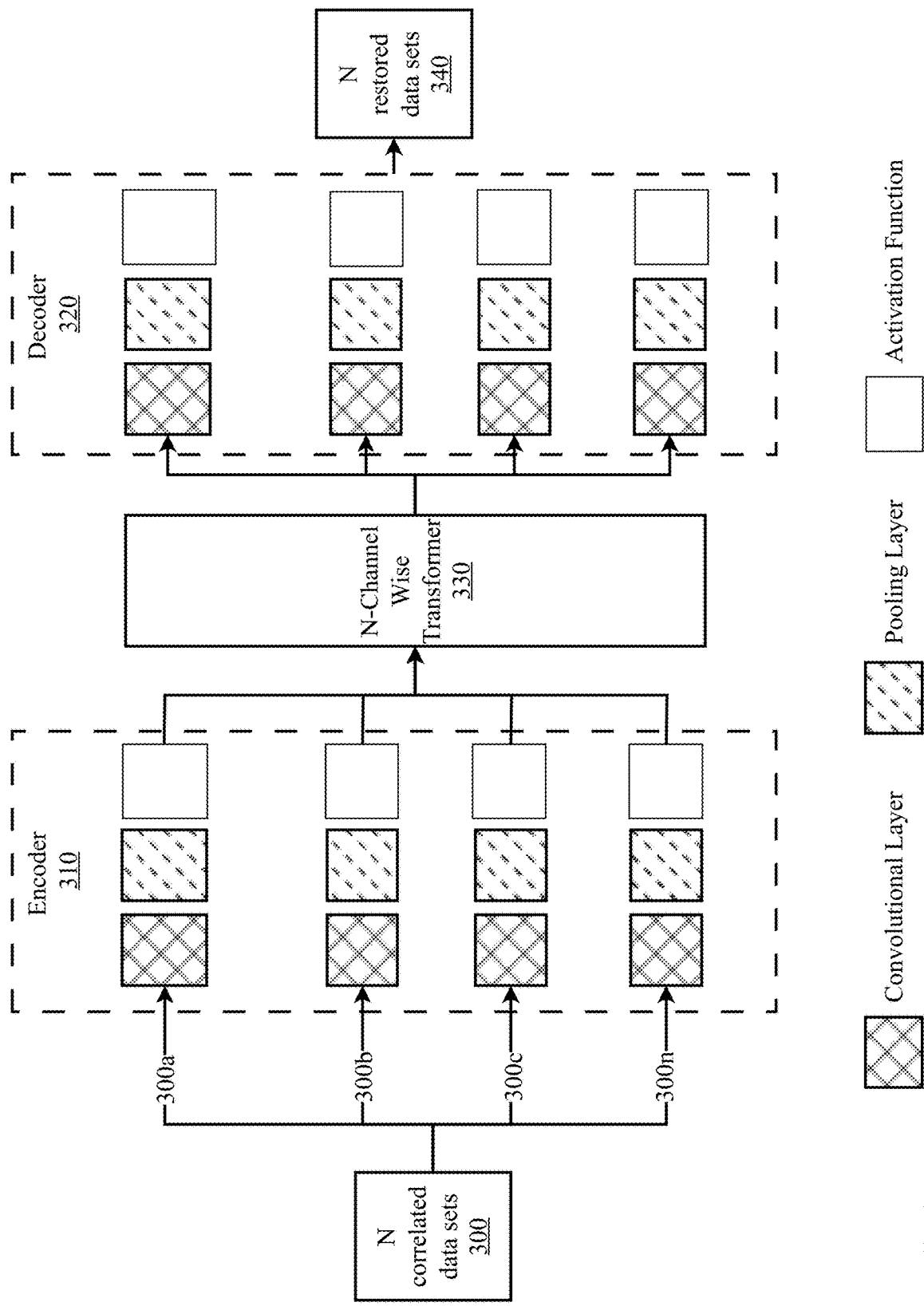
FIG. 3 is a block diagram illustrating an exemplary architecture for a subsystem of the system for compressing and restoring data using multi-level autoencoders and correlation networks, a correlation network.

FIG. 3 is a block diagram illustrating an exemplary architecture for a subsystem of the system for compressing and restoring data using multi-level autoencoders and correlation networks, a correlation network. The correlation network 160 is designed to enhance the reconstruction of decompressed data by leveraging correlations and patterns within the data. The correlation network 160 may also be referred to as a neural upsampler. The correlation network 160 comprises a plurality of correlation network elements that work together to capture and utilize the correlations for improved data reconstruction. Each correlation network element within the correlation network 160 contributes to the correlation learning and data reconstruction process. These elements include, but are not limited to, convolutional layers, skip connections, pooling layers and activation functions such as but not limited to, rectified linear unit functions or sigmoid functions.

The convolutional layers are responsible for extracting meaningful features from the input data. They apply convolutional operations using learnable filters to capture spatial patterns and hierarchical representations of the data. The convolutional layers can have different numbers of filters, kernel sizes, and strides to capture features at various scales and resolutions. Skip connections are employed to facilitate the flow of information across different layers of the autoencoder. Skip connections allow the output of a layer to be directly added to the output of a subsequent layer, enabling the network to learn residual mappings and mitigate the vanishing gradient problem. Skip connections help in preserving fine-grained details and improving the training stability of the autoencoder.

Pooling layers are used to downsample the feature maps generated by the convolutional layers. They reduce the spatial dimensions of the feature maps while retaining the most salient information. Common pooling operations include but are not limited to max pooling and average pooling. Pooling layers help in achieving translation invariance, reducing computational complexity, and controlling the receptive field of the autoencoder. Rectified Linear Unit (ReLU) functions introduce non-linearity into the autoencoder by applying a ReLU activation function element-wise to the output of the previous layer. ReLU functions help in capturing complex patterns and relationships in the data by allowing the network to learn non-linear transformations. They also promote sparsity and alleviate the vanishing gradient problem.

In one embodiment, the correlation network 160 may comprise an encoder 310, a decoder 320, an N number of correlated data sets 300, an N number-channel wise transformer 330, and an N number of restored data sets 340. Additionally, the correlation network 160 may be comprised of a plurality of convolutional layers, pooling layers, and activation functions. In one embodiment, the correlation network 160 may be configured to receive N correlated data sets 300 where each correlated data set includes a plurality of decompressed data points. In one embodiment, the correlation network 160 may be configured to receive four correlated data sets as an input. The correlated data sets may have been organized by a decompressed output organizer 170 to maximize the similarities between the data points in each set. One data set, 300, may include data points $300a$, $300b$, $300c$, through $300n$, where the decompressed output organizer 170 has determined the N number of data points are similar enough to be grouped together. The correlation network 160 may then receive and process full data sets at a time. In FIG. 3, the data is processed through an encoder 310 by passing through a convolutional layer, a pooling layer, and an activation function. Activation functions introduce non-linearity into the network, enabling it to learn and represent complex patterns and relationships in the data. Common activation functions include but are not limited to sigmoid, tanh, ReLU (Rectified Linear Unit), and its variants. These functions have different properties and are chosen based on the specific requirements of the task and the network architecture. For example, ReLU is widely used in deep neural networks due to its ability to alleviate the vanishing gradient problem and promote sparsity in the activations. By applying activation functions, the neural network can learn capture non-linear relationships in the data, enabling it to model complex patterns and make accurate predictions or decisions.

The encoder 310 breaks the decompressed outputs passed by the decompressed output organizer 170 down into smaller representations of the original data sets. Following the encoder the data may pass through a transformer 330. A transformer is a type of neural network architecture that may rely on a self-attention mechanism which allows the model to weigh the importance of different parts of the input sequence when processing each element. This enables the transformer to capture dependencies and relationships between elements in the sequence efficiently. After being processed by a transformer 330, the data sets may be further processed by a decoder 320 which restores the smaller representations back into the original decompressed data sets. The decoder 320 may have a similar composition as the encoder 310, but reversed, to undo the operations performed on the data sets by the encoder 310. The transformer 330 may identify important aspects in each group of decompressed data passed through the correlation network which allows the decoder 320 to rebuild a more complete version of the original decompressed data sets. The decoder 320 may output an N number of restored data sets 340 which correspond to the N number of correlated data sets 300 originally passed through the correlation network 170.

Figure 4:
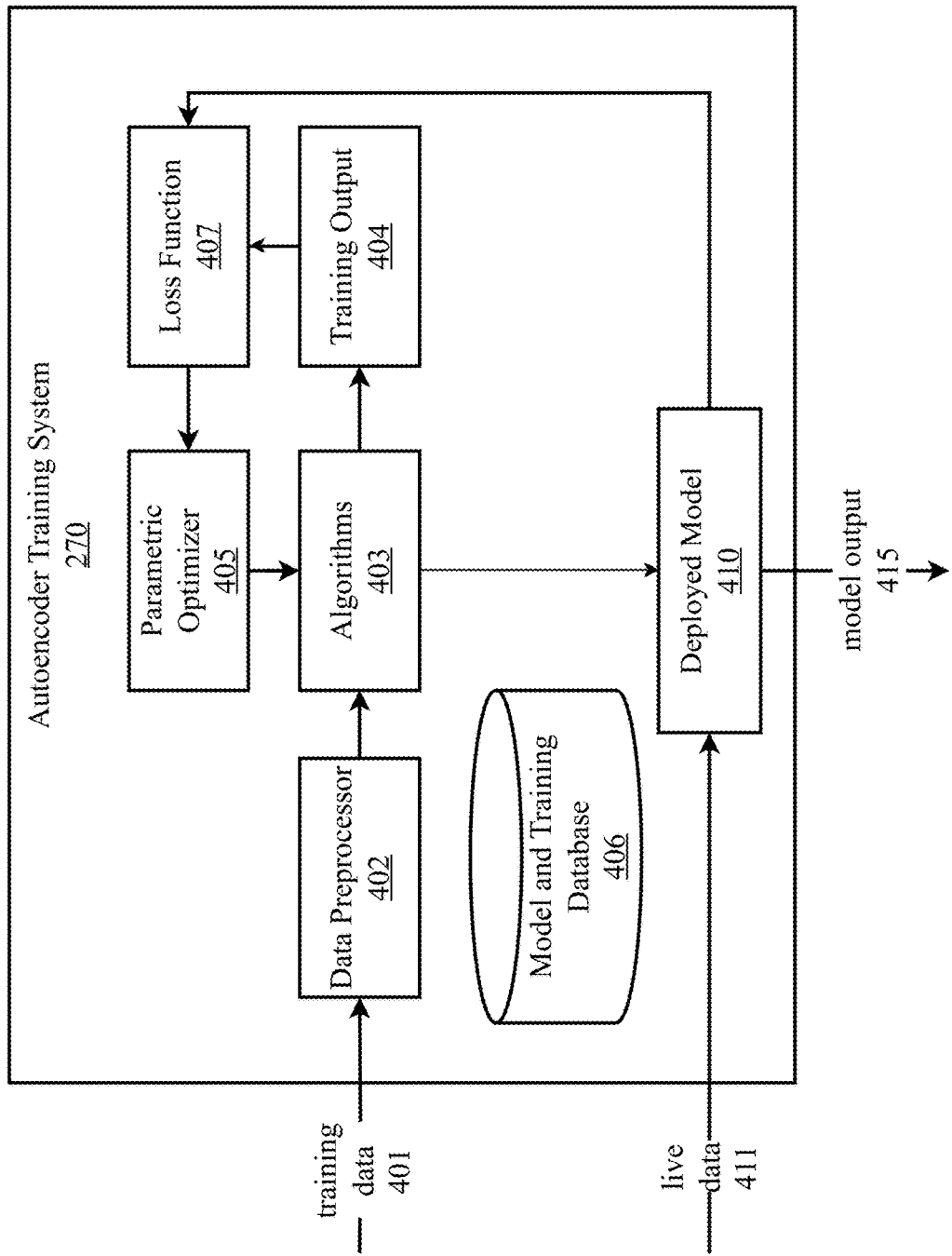
FIG. 4 is a block diagram illustrating an exemplary architecture for a subsystem of the system for compressing and restoring data using multi-level autoencoders and correlation networks, an autoencoder training system.

FIG. 4 is a block diagram illustrating an exemplary aspect of a platform for a subsystem of the system for compressing and restoring data using multi-level autoencoders and correlation networks, an autoencoder training system 270. According to the embodiment, the autoencoder training system 270 may comprise a model training stage comprising a data preprocessor 402, one or more machine and/or deep learning algorithms 403, training output 404, and a parametric optimizer 405, and a model deployment stage comprising a deployed and fully trained model 410 configured to perform tasks described herein such as transcription, summarization, agent coaching, and agent guidance. Autoencoder training system 270 may be used to train and deploy the multi-layer autoencoder network 210 in order to support the services provided by the compression and restoration system.

At the model training stage, a plurality of training data 401 may be received at the autoencoder training system 270. In some embodiments, the plurality of training data may be obtained from one or more storage systems 150 and/or directly from various information sources. In a use case directed to hyperspectral images, a plurality of training data may be sourced from data collectors including but not limited to: satellites, airborne sensors, unmanned aerial vehicles, ground-based sensors, and medical devices. Hyperspectral data refers to data that includes wide ranges of the electromagnetic spectrum. It could include information in ranges including but not limited to the visible spectrum and the infrared spectrum. Data preprocessor 402 may receive the input data (e.g., hyperspectral data) and perform various data preprocessing tasks on the input data to format the data for further processing. For example, data preprocessing can include, but is not limited to, tasks related to data cleansing, data deduplication, data normalization, data transformation, handling missing values, feature extraction and selection, mismatch handling, and/or the like. Data preprocessor 402 may also be configured to create training dataset, a validation dataset, and a test set from the plurality of input data 401. For example, a training dataset may comprise 80% of the preprocessed input data, the validation set 10%, and the test dataset may comprise the remaining 10% of the data. The preprocessed training dataset may be fed as input into one or more machine and/or deep learning algorithms 403 to train a predictive model for object monitoring and detection.

During model training, training output 404 is produced and used to measure the quality and efficiency of the compressed outputs. During this process a parametric optimizer 405 may be used to perform algorithmic tuning between model training iterations. Model parameters and hyperparameters can include, but are not limited to, bias, train-test split ratio, learning rate in optimization algorithms (e.g., gradient descent), choice of optimization algorithm (e.g., gradient descent, stochastic gradient descent, of Adam optimizer, etc.), choice of activation function in a neural network layer (e.g., Sigmoid, ReLu, Tanh, etc.), the choice of cost or loss function the model will use, number of hidden layers in a neural network, number of activation unites in each layer, the drop-out rate in a neural network, number of iterations (epochs) in a training the model, number of clusters in a clustering task, kernel or filter size in convolutional layers, pooling size, batch size, the coefficients (or weights) of linear or logistic regression models, cluster centroids, and/or the like. Parameters and hyperparameters may be tuned and then applied to the next round of model training. In this way, the training stage provides a machine learning training loop.

In some implementations, various accuracy metrics may be used by the autoencoder training system 270 to evaluate a model's performance. Metrics can include, but are not limited to, compression ratio, the amount of data lost, the size of the compressed file, and the speed at which data is compressed, to name a few. In one embodiment, the system may utilize a loss function 407 to measure the system's performance. The loss function 407 compares the training outputs with an expected output and determined how the algorithm needs to be changed in order to improve the quality of the model output. During the training stage, all outputs may be passed through the loss function 407 on a continuous loop until the algorithms 403 are in a position where they can effectively be incorporated into a deployed model 415.

The test dataset can be used to test the accuracy of the model outputs. If the training model is compressing or decompressing data to the user's preferred standards, then it can be moved to the model deployment stage as a fully trained and deployed model 410 in a production environment compressing or decompressing live input data 411 (e.g., hyperspectral data). Further, model compressions or decompressions made by deployed model can be used as feedback and applied to model training in the training stage, wherein the model is continuously learning over time using both training data and live data and predictions.

A model and training database 406 is present and configured to store training/test datasets and developed models. Database 406 may also store previous versions of models. According to some embodiments, the one or more machine and/or deep learning models may comprise any suitable algorithm known to those with skill in the art including, but not limited to: LLMs, generative transformers, transformers, supervised learning algorithms such as: regression (e.g., linear, polynomial, logistic, etc.), decision tree, random forest, k-nearest neighbor, support vector machines, Naïve-Bayes algorithm; unsupervised learning algorithms such as clustering algorithms, hidden Markov models, singular value decomposition, and/or the like. Alternatively, or additionally, algorithms 403 may comprise a deep learning algorithm such as neural networks (e.g., recurrent, convolutional, long short-term memory networks, etc.). In some implementations, the autoencoder training system 270 automatically generates standardized model scorecards for each model produced to provide rapid insights into the model and training data, maintain model provenance, and track performance over time. These model scorecards provide insights into model framework(s) used, training data, training data specifications such as chip size, stride, data splits, baseline hyperparameters, and other factors. Model scorecards may be stored in database(s) 406.

Figure 5:
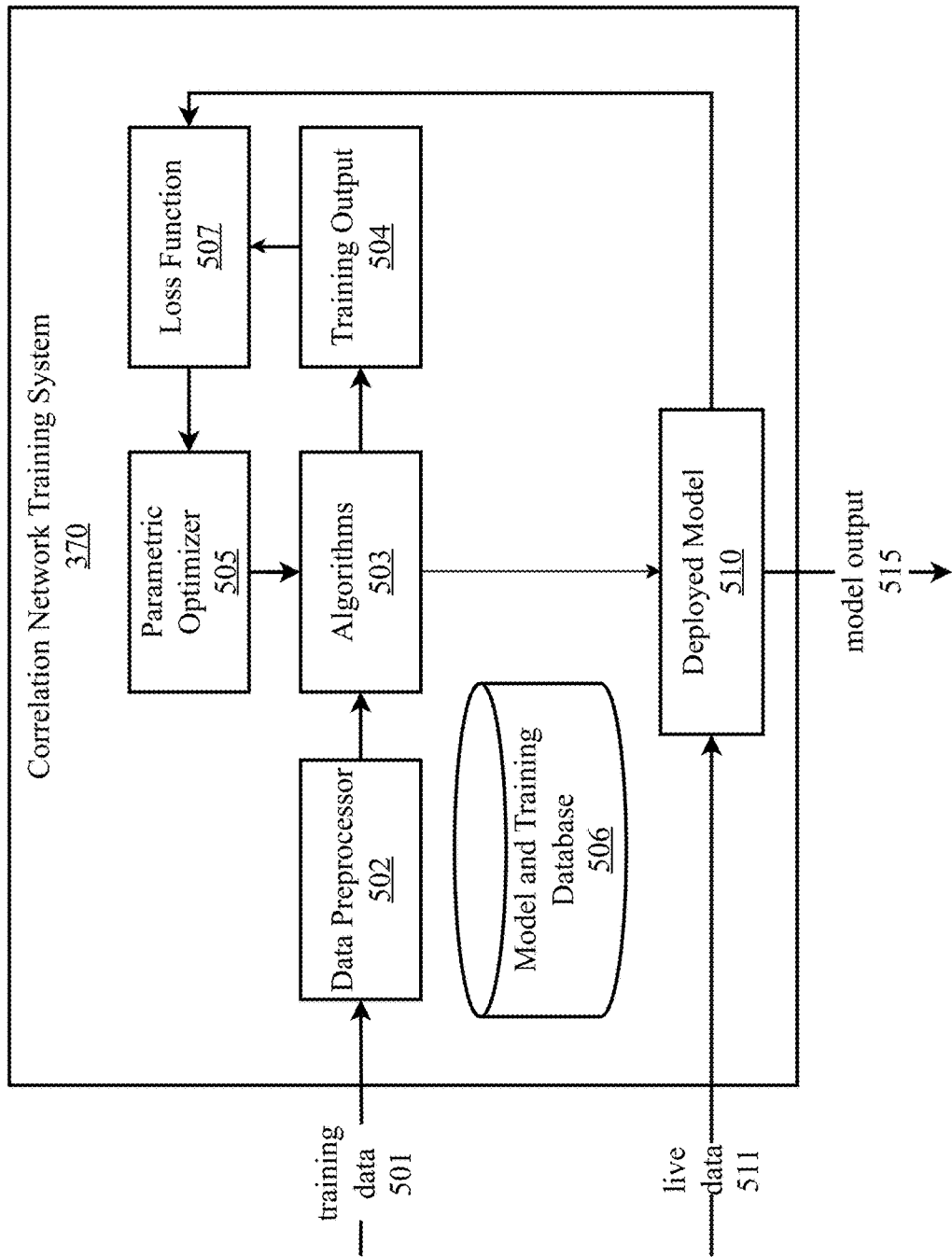
FIG. 5 is a block diagram illustrating an exemplary architecture for a subsystem of the system for compressing and restoring data using multi-level autoencoders and correlation networks, correlation network training system.

FIG. 5 is a block diagram illustrating an exemplary aspect of a subsystem of the system for compressing and restoring data using multi-level autoencoders and correlation networks, a correlation network training system 370. According to the embodiment, correlation network training system 370 may comprise a model training stage comprising a data preprocessor 502, one or more machine and/or deep learning algorithms 503, training output 504, and a parametric optimizer 505, and a model deployment stage comprising a deployed and fully trained model 510 configured to perform tasks described herein such determining correlations between compressed data sets. The correlation network training system 370 may be used to train and deploy the correlation network 300 in order to support the services provided by the compression and decompression system.

At the model training stage, a plurality of training data 501 may be received by the correlation network training system 500. In some embodiments, the plurality of training data may be obtained from one or more storage systems 150 and/or directly from the compression network 131. In some embodiments, the correlation network training system may obtain data sets from a vector grouping system 180. In a use case directed to hyperspectral data sets, a plurality of decompressed training data may be sourced from a hyperspectral data compression system. Data preprocessor 502 may receive the input data (e.g., decompressed hyperspectral data) and perform various data preprocessing tasks on the input data to format the data for further processing. For example, data preprocessing can include, but is not limited to, tasks related to data cleansing, data deduplication, data normalization, data transformation, handling missing values, feature extraction and selection, mismatch handling, and/or the like. Data preprocessor 502 may also be configured to create training dataset, a validation dataset, and a test set from the plurality of input data 501. For example, a training dataset may comprise 80% of the preprocessed input data, the validation set 10%, and the test dataset may comprise the remaining 10% of the data. The preprocessed training dataset may be fed as input into one or more machine and/or deep learning algorithms 503 to train a predictive model for object monitoring and detection.

During model training, training output 504 is produced and used to measure the accuracy and usefulness of the predictive outputs. During this process a parametric optimizer 505 may be used to perform algorithmic tuning between model training iterations. Model parameters and hyperparameters can include, but are not limited to, bias, train-test split ratio, learning rate in optimization algorithms (e.g., gradient descent), choice of optimization algorithm (e.g., gradient descent, stochastic gradient descent, of Adam optimizer, etc.), choice of activation function in a neural network layer (e.g., Sigmoid, ReLu, Tanh, etc.), the choice of cost or loss function the model will use, number of hidden layers in a neural network, number of activation unites in each layer, the drop-out rate in a neural network, number of iterations (epochs) in a training the model, number of clusters in a clustering task, kernel or filter size in convolutional layers, pooling size, batch size, the coefficients (or weights) of linear or logistic regression models, cluster centroids, and/or the like. Parameters and hyperparameters may be tuned and then applied to the next round of model training. In this way, the training stage provides a machine learning training loop.

In some implementations, various accuracy metrics may be used by machine learning engine 400 to evaluate a model's performance. Metrics can include, but are not limited to, word error rate (WER), word information loss, speaker identification accuracy (e.g., single stream with multiple speakers), inverse text normalization and normalization error rate, punctuation accuracy, timestamp accuracy, latency, resource consumption, custom vocabulary, sentence-level sentiment analysis, multiple languages supported, cost-to-performance tradeoff, and personal identifying information/payment card industry redaction, to name a few. In one embodiment, the system may utilize a loss function 507 to measure the system's performance. The loss function 507 compares the training outputs with an expected output and determined how the algorithm needs to be changed in order to improve the quality of the model output. During the training stage, all outputs may be passed through the loss function 507 on a continuous loop until the algorithms 503 are in a position where they can effectively be incorporated into a deployed model 515.

The test dataset can be used to test the accuracy of the model outputs. If the training model is establishing correlations that satisfy a certain criterion such as but not limited to quality of the correlations and amount of restored lost data, then it can be moved to the model deployment stage as a fully trained and deployed model 510 in a production environment making predictions based on live input data 511 (e.g., compressed hyperspectral data). Further, model correlations and restorations made by deployed model can be used as feedback and applied to model training in the training stage, wherein the model is continuously learning over time using both training data and live data and predictions. A model and training database 506 is present and configured to store training/test datasets and developed models. Database 506 may also store previous versions of models.

According to some embodiments, the one or more machine and/or deep learning models may comprise any suitable algorithm known to those with skill in the art including, but not limited to: LLMs, generative transformers, transformers, supervised learning algorithms such as: regression (e.g., linear, polynomial, logistic, etc.), decision tree, random forest, k-nearest neighbor, support vector machines, Naïve-Bayes algorithm; unsupervised learning algorithms such as clustering algorithms, hidden Markov models, singular value decomposition, and/or the like. Alternatively, or additionally, algorithms 503 may comprise a deep learning algorithm such as neural networks (e.g., recurrent, convolutional, long short-term memory networks, etc.).

In some implementations, the correlation network training system 270 automatically generates standardized model scorecards for each model produced to provide rapid insights into the model and training data, maintain model provenance, and track performance over time. These model scorecards provide insights into model framework(s) used, training data, training data specifications such as chip size, stride, data splits, baseline hyperparameters, and other factors. Model scorecards may be stored in database(s) 506.

Detailed Description of Exemplary Aspects

Figure 6:
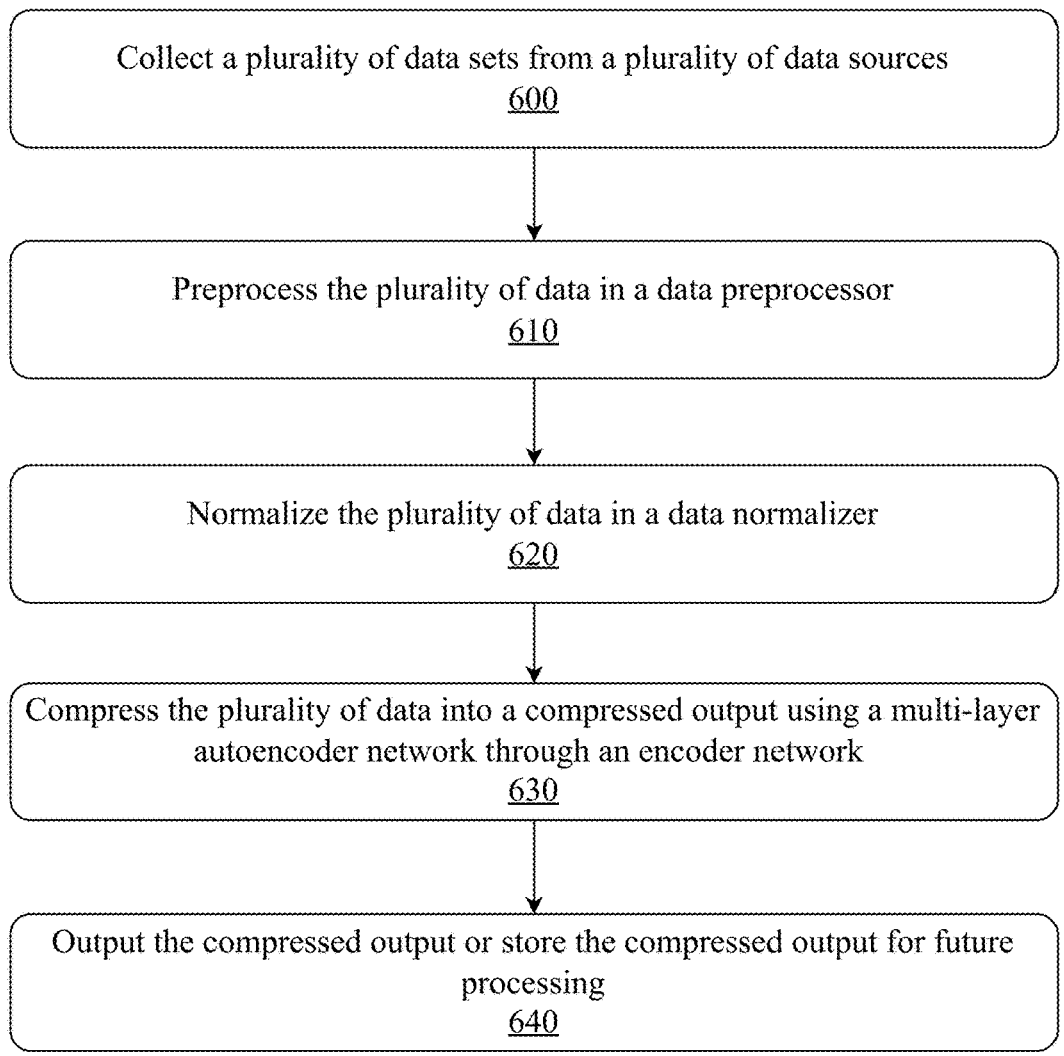
FIG. 6 is a flow diagram illustrating an exemplary method for compressing a data input using a system for compressing and restoring data using multi-level autoencoders and correlation networks.

FIG. 6 is a flow diagram illustrating an exemplary method for compressing a data input using a system for compressing and restoring data using multi-level autoencoders and correlation networks. In a first step 600, a plurality of data sets is collected from a plurality of data sources. These data sources can include various sensors, devices, databases, or any other systems that generate or store data. The data sets may be heterogeneous in nature, meaning they can have different formats, structures, or modalities. For example, the data sets can include images, videos, audio recordings, time-series data, numerical data, or textual data. The collection process involves acquiring the data sets from their respective sources and bringing them into a centralized system for further processing.

In a step 610, the collected data sets are preprocessed using a data preprocessor. The data preprocessor may be responsible for cleaning, transforming, and preparing the data sets for subsequent analysis and compression. Preprocessing tasks may include but are not limited to data cleansing, data integration, data transformation, and feature extraction. Data cleansing involves removing or correcting any erroneous, missing, or inconsistent data points. Data integration combines data from multiple sources into a unified format. Data transformation converts the data into a suitable representation for further processing, such as scaling, normalization, or encoding categorical variables. Feature extraction identifies and selects relevant features or attributes from the data sets that are most informative for the given task.

A step 620 involves normalizing the preprocessed data sets using a data normalizer. Normalization is a step that brings the data into a common scale and range. It helps to remove any biases or inconsistencies that may exist due to different units or scales of measurement. The data normalizer applies various normalization techniques, such as min-max scaling, z-score normalization, or unit vector normalization, depending on the nature of the data and the requirements of the subsequent compression step. Normalization ensures that all the data sets have a consistent representation and can be compared and processed effectively.

In a step 630, the normalized data sets are compressed into a compressed output using a multi-layer autoencoder network. The multi-layer autoencoder network is a deep learning model designed to learn compact and meaningful representations of the input data. It consists of an encoder network and a decoder network. The encoder network takes the normalized data sets as input and progressively compresses them through a series of layers, such as but not limited to convolutional layers, pooling layers, and fully connected layers. The compressed representation is obtained at the bottleneck layer of the encoder network, which has a significantly reduced dimensionality compared to the original data. The multi-layer autoencoder network may utilize a plurality of encoder networks to achieve optimal compression performance. These encoder networks can include different architectures, loss functions, or optimization techniques. The choice of compression technique depends on the specific characteristics and requirements of the data sets being compressed. During the compression process, the multi-layer autoencoder network learns to capture the essential features and patterns present in the data sets while discarding redundant or irrelevant information. It aims to minimize the reconstruction error between the original data and the reconstructed data obtained from the compressed representation. In step 640, the compressed output generated by the multi-layer autoencoder network is either outputted or stored for future processing. The compressed output represents the compact and informative representation of the original data sets. It can be transmitted, stored, or further analyzed depending on the specific application or use case. The compressed output significantly reduces the storage and transmission requirements compared to the original data sets, making it more efficient for downstream tasks.

Figure 7:
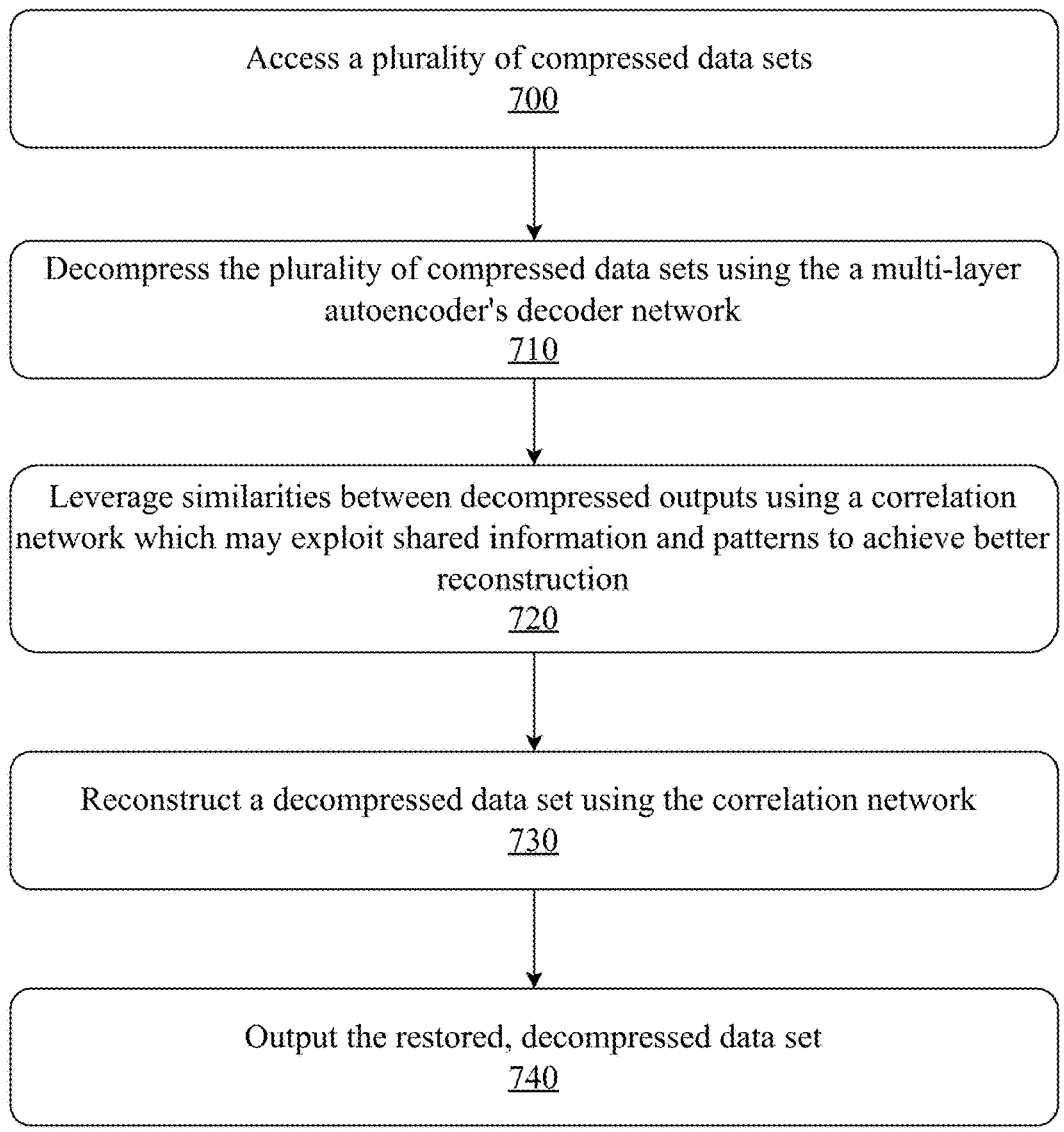
FIG. 7 is a flow diagram illustrating an exemplary method for decompressing a compressed data input using system for compressing and restoring data using multi-level autoencoders and correlation networks.

FIG. 7 is a flow diagram illustrating an exemplary method for decompressing a compressed data input using system for compressing and restoring data using multi-level autoencoders and correlation networks. In a first step, 700, access a plurality of compressed data sets. In a step 710, decompress the plurality of compressed data sets using a multi-layer autoencoder's decoder network. The decoder network is responsible for mapping the latent space vectors back to the original data space. The decoder network may include techniques such as transposed convolutions, upsampling layers, or generative models, depending on the specific requirements of the data and the compression method used.

In a step 720, leverage the similarities between decompressed outputs using a correlation network which may exploit shared information and patterns to achieve a better reconstruction. The correlation network is a deep learning model specifically designed to exploit the shared information and patterns among the compressed data sets. It takes the organized decompressed data sets as input and learns to capture the correlations and dependencies between them. The correlation network may consist of multiple layers, such as convolutional layers, recurrent layers, or attention mechanisms, which enable it to effectively model the relationships and similarities among the compressed data sets.

In a step 730, the compressed data sets are reconstructed using the correlation network. The reconstruction process in step 730 combines the capabilities of the correlation network and the decompression systems. The correlation network provides the enhanced and refined latent space representations, while the decompression systems use these representations to generate the reconstructed data. In a step 740, the restored, decompressed data set is outputted. The restored data set represents the reconstructed version of the original data, which includes recovered information lost during the compression process. The outputted data set more closely resembles the original data than would a decompressed output passed solely through a decoder network.

Figure 8:
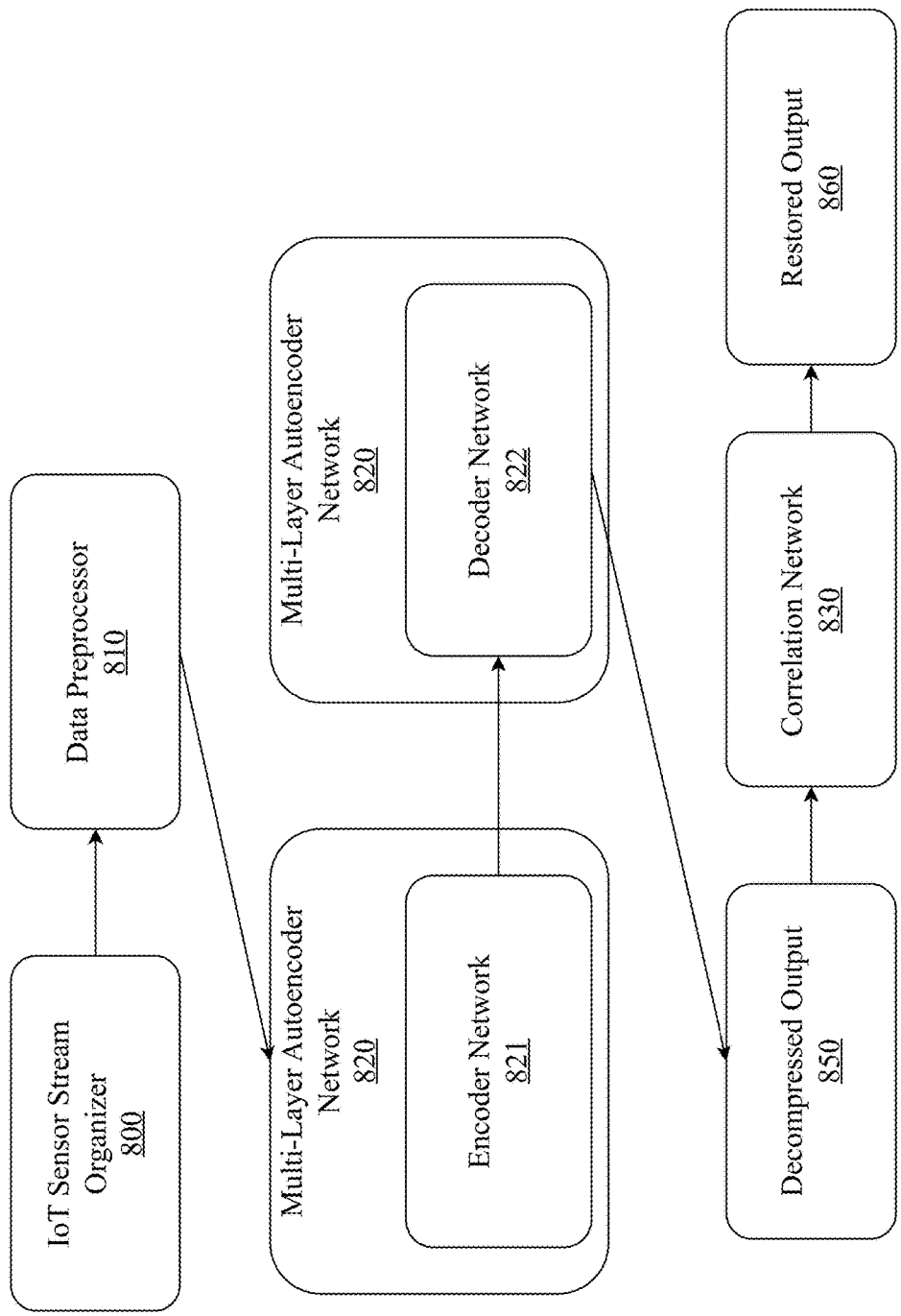
FIG. 8 is a block diagram illustrating an exemplary system architecture for compressing and restoring IoT sensor data using a system for compressing and restoring data using multi-level autoencoders and correlation networks.

FIG. 8 is a block diagram illustrating an exemplary system architecture for compressing and restoring IoT sensor data using a system for compressing and restoring data using multi-level autoencoders and correlation networks. The IoT Sensor Stream Organizer 800 is responsible for collecting and organizing data streams from various IoT sensors. It receives raw sensor data from multiple sources, such as but not limited to temperature sensors, humidity sensors, and accelerometers. The IoT Sensor Stream Organizer 800 may perform necessary preprocessing tasks, such as data cleaning, normalization, and synchronization, to ensure the data is in a suitable format for further processing. The preprocessed IoT sensor data is then passed to a data preprocessor 810. The data preprocessor 810 prepares the data for compression by transforming it into a latent space representation. It applies techniques such as feature extraction, dimensionality reduction, and data normalization to extract meaningful features and reduce the dimensionality of the data. The latent space representation captures the essential characteristics of the IoT sensor data while reducing its size.

The multi-layer autoencoder 820 is responsible for compressing and decompressing the latent space representation of the IoT sensor data. It consists of an encoder network 821 and a decoder network 822. The encoder network 821 takes the latent space representation as input and progressively compresses it through a series of layers, such as but not limited to convolutional layers, pooling layers, and fully connected layers. The compressed representation may pass through a bottleneck layer which transforms the original data to have a significantly reduced dimensionality compared to the original data. Further, the encoder network 821 manages the compression process and stores the compressed representation of the IoT sensor data. It determines the optimal compression settings based on factors such as the desired compression ratio, data characteristics, and available storage resources. The compressed representation is efficiently stored or transmitted, reducing the storage and bandwidth requirements for IoT sensor data.

The decoder network 822 is responsible for reconstructing the original IoT sensor data from the compressed representation. It utilizes the multi-layer autoencoder 820 to map the compressed representation back to the original data space. The decoder network consists of layers such as transposed convolutional layers, upsampling layers, and fully connected layers. It learns to reconstruct the original data by minimizing the reconstruction error between the decompressed output and the original IoT sensor data. The decompressed output 850 represents the decompressed IoT sensor data obtained from the decoder network 822. It closely resembles the original data and retains the essential information captured by the sensors, but includes some information lost during the compressed process. The decompressed output 850 may be further processed, analyzed, or utilized by downstream applications or systems.

To further enhance the compression and reconstruction quality, the system includes a correlation network 830. The correlation network 830 learns and exploits correlations and patterns within the IoT sensor data to improve the reconstruction process. It consists of multiple correlation layers that capture dependencies and relationships among different sensors or data streams. The correlation network 830 helps in preserving important information that may have been lost during the compression process. Following the identification of dependencies and relationships among different data streams, the correlation network 830 reconstruct a decompressed output 850 into a restored output 860 which recovers much of the data lost during the compression and decompression process.

The system may be trained using an end-to-end approach, where the multi-layer autoencoder 820 and the correlation network 830 are jointly optimized to minimize the reconstruction error and maximize the compression ratio. The training process may involves feeding the IoT sensor data through the system, comparing the decompressed output with the original data, and updating the network parameters using backpropagation and gradient descent techniques. The proposed system offers several advantages for IoT sensor data compression. It achieves high compression ratios while preserving the essential information in the data. The multi-layer autoencoder 820 learns compact and meaningful representations of the data, exploiting spatial and temporal correlations. The correlation network 830 further enhances the compression quality by capturing dependencies and patterns within the data. Moreover, the system is adaptable and can handle various types of IoT sensor data, making it suitable for a wide range of IoT applications. It can be deployed on resource-constrained IoT devices or edge servers, reducing storage and transmission costs while maintaining data quality.

Figure 9:
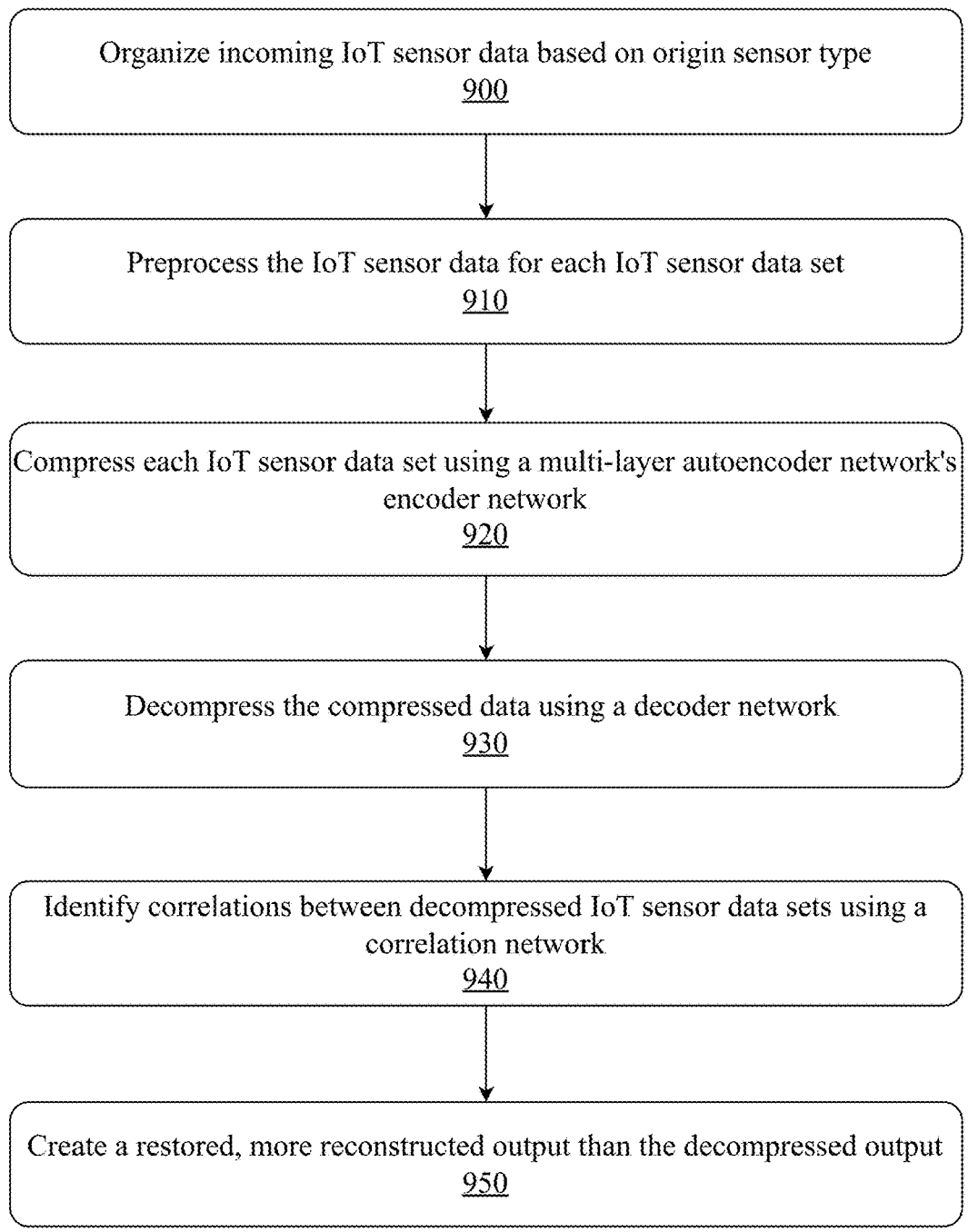
FIG. 9 is a flow diagram illustrating an exemplary method for compressing and decompressing IoT sensor data using a system for compressing and restoring data using multi-level autoencoders and correlation networks.

FIG. 9 is a flow diagram illustrating an exemplary method for compressing and decompressing IoT sensor data using a system for compressing and restoring data using multi-level autoencoders and correlation networks. In a first step 900, incoming IoT sensor data is organized based on its origin sensor type. IoT sensor data can be generated from various types of sensors, such as but not limited to temperature sensors, humidity sensors, pressure sensors, accelerometers, or any other sensors deployed in an IoT network. Each sensor type captures specific measurements or data points relevant to its function. The organization step involves categorizing and grouping the incoming IoT sensor data based on the type of sensor it originated from. This step helps to maintain a structured and organized representation of the data, facilitating subsequent processing and analysis.

In a step 910, the latent space vectors for each IoT sensor data set are preprocessed. Latent space vectors are lower-dimensional representations of the original data that capture the essential features and patterns. Preprocessing the latent space vectors involves applying various techniques to ensure data quality, consistency, and compatibility. This may include but is not limited to data cleaning, normalization, feature scaling, or dimensionality reduction. The preprocessing step aims to remove any noise, outliers, or inconsistencies in the latent space vectors and prepare them for the compression process.

A step 920 involves compressing each IoT sensor data set using a multi-layer autoencoder network. The multi-layer autoencoder network is a deep learning model designed to learn compact and meaningful representations of the input data. It consists of a encoder network and a decoder network. The encoder network takes the preprocessed latent space vectors as input and progressively compresses them through a series of layers, such as convolutional layers, pooling layers, and fully connected layers. The compressed representation is obtained at the bottleneck layer of the encoder network, which has a significantly reduced dimensionality compared to the original data. The multi-layer autoencoder network may include a compression system that specifically handles the compression of IoT sensor data. The compression system can employ various techniques, such as quantization, entropy coding, or sparse representations, to achieve efficient compression while preserving the essential information in the data. The compression system outputs a compressed IoT sensor data set, which is a compact representation of the original data. In step 930, the original IoT sensor data is decompressed using a decoder network. The decoder network is responsible for reconstructing the original data from the compressed representation. It takes the compressed IoT sensor data sets and applies a series of decompression operations, such as transposed convolutions or upsampling layers, to map the compressed data back to its original dimensionality.

In a step 940, correlations between compressed IoT sensor data sets are identified using a correlation network. The correlation network is a separate deep learning model that learns to capture the relationships and dependencies among different compressed IoT sensor data sets. It takes the decompressed data sets as input and identifies patterns, similarities, and correlations among them. The correlation network can utilize techniques such as convolutional layers, attention mechanisms, or graph neural networks to effectively model the interactions and dependencies between the compressed data sets. The identified correlations provide valuable insights into how different IoT sensor data sets are related and how they influence each other. These correlations can be used to improve the compression efficiency and enhance the restoration quality of the data.

In a step 950, the correlation network creates a restored, more reconstructed version of the decompressed output. By leveraging correlations between decompressed outputs, the correlation network is able to recover a large portion of information lost during the compression and decompression process. The restored, reconstructed output is similar to the decompressed output and the original input, but recovers information that may have been missing in the decompressed output.

Figure 10:
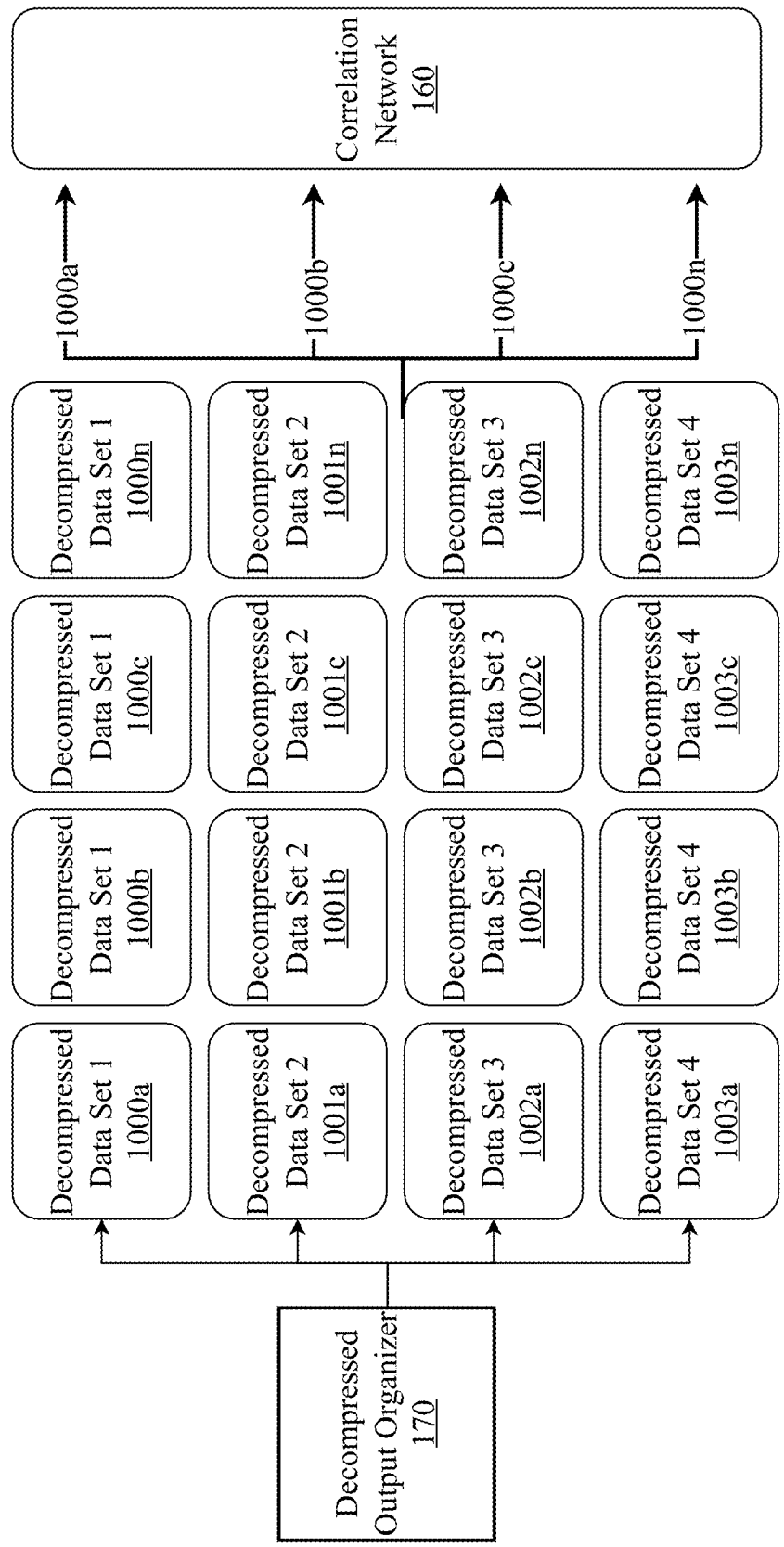
FIG. 10 is a block diagram illustrating an exemplary system architecture for a subsystem of the system for compressing and restoring data using multi-level autoencoders and correlation networks, the decompressed output organizer.

FIG. 10 is a block diagram illustrating an exemplary system architecture for a subsystem of the system for compressing and restoring data using multi-level autoencoders and correlation networks, the decompressed output organizer. In one embodiment, the decompressed output organizer 170 may create a matrix of n by n data sets where each data sets represents a decompressed set of information. In the embodiment depicted, the decompressed output organizer 170 outputs a 4 by 4 matrix of decompressed data sets. The organizer 170 may organizer the decompressed data sets into groups based on how correlated each data set is to each other. For example, decompressed data set 1 which includes 1000a, 1000b, 1000c, and 1000n, is a set of four data sets that the decompressed output organizer 170 has determined to be highly correlated. The same is true for decompressed data sets 2, 3, and 4.

The decompressed output organizer primes the correlation network 160 to receive an already organizer plurality of inputs. The correlation network may take a plurality of decompressed data sets as its input, depending on the size of the organized matrix produced by the decompressed output organizer 170. For example, in the embodiment depicted in FIG. 10, the decompressed output organizer 170 produces a 4 by 4 matrix of data sets. The correlation network in turn receives a 4 element data set as its input. If decompressed data set 1 were to be processed by the correlation network 160, the correlation network 160 may take 1000a, 1000b, 1000c, and 1000n, as the inputs and process all four data sets together. By clustering data sets together into groups based on how correlated they are, the decompressed output organizer 170 allows the correlation network 160 to produce more outputs that better encompass the original pre-compressed and decompressed data sets. More information may be recovered by the correlation network 160 when the inputs are already highly correlated.

Figure 11:
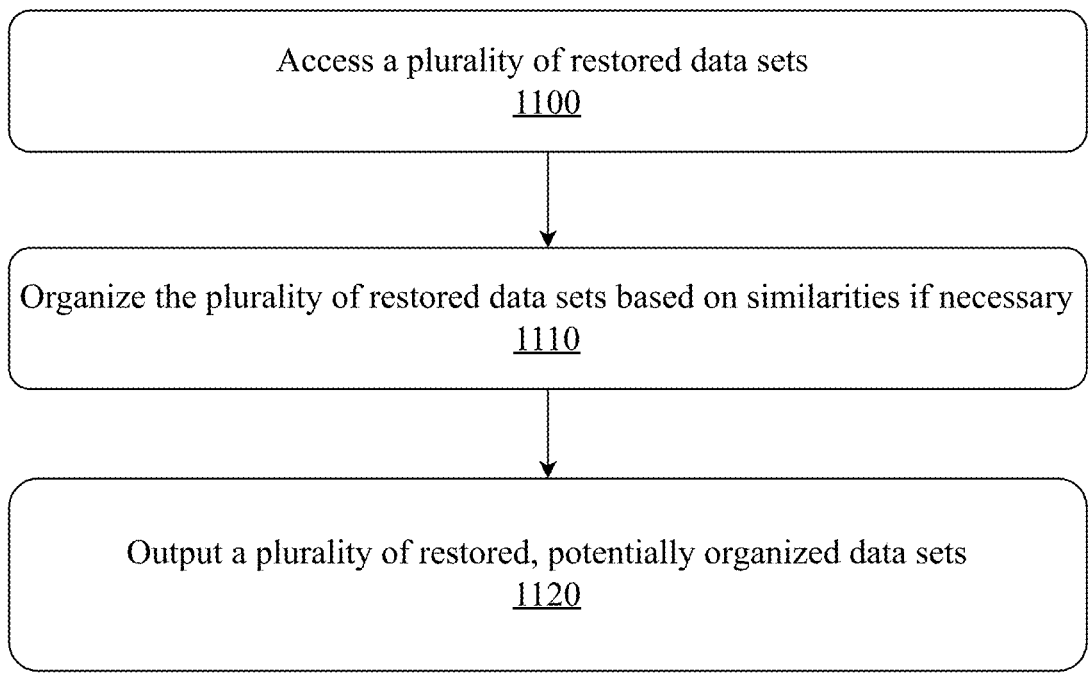
FIG. 11 is a flow diagram illustrating an exemplary method for organizing restored, decompressed data sets after correlation network processing.

FIG. 11 is a flow diagram illustrating an exemplary method for organizing restored, decompressed data sets after correlation network processing. In a first step 1100, access a plurality of restored data sets. In a step 1110, organize the plurality of restored data sets based on similarities if necessary. In a step 1120, output a plurality of restored, potentially organizer data sets. This method essentially reassesses the organizational grouping performed by the decompressed output organizer 170. The correlation network 160 may output a matrix where the matrix contains a plurality of restored, decompressed data sets. The final output of the system may reorganize the restored, decompressed data sets within the outputted matrix based on user preference and the correlations between each data set within the matrix.

Exemplary Computing Environment

Figure 12:
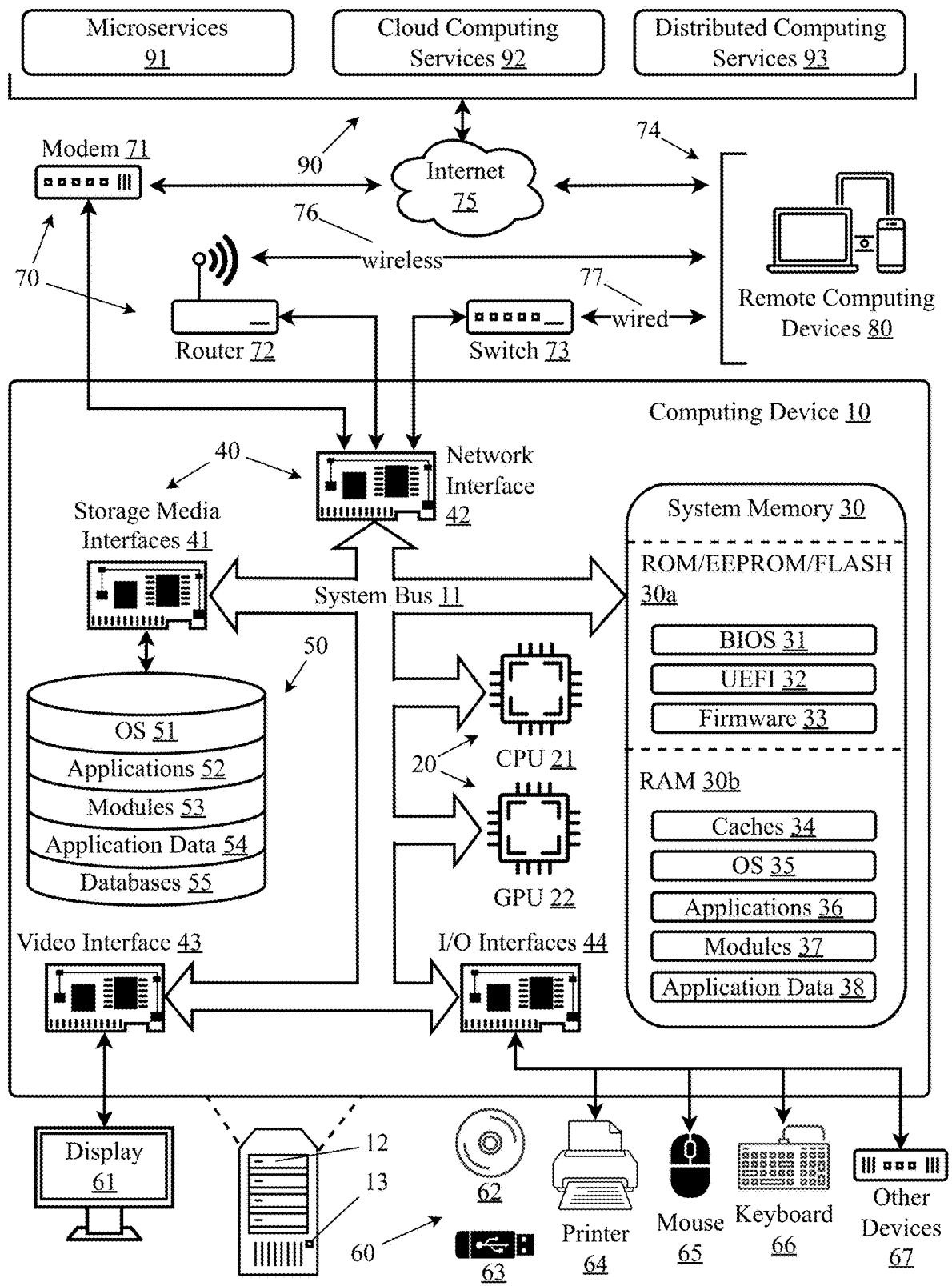
FIG. 12 illustrates an exemplary computing environment on which an embodiment described herein may be implemented, in full or in part.

FIG. 12 illustrates an exemplary computing environment on which an embodiment described herein may be implemented, in full or in part. This exemplary computing environment describes computer-related components and processes supporting enabling disclosure of computer-implemented embodiments. Inclusion in this exemplary computing environment of well-known processes and computer components, if any, is not a suggestion or admission that any embodiment is no more than an aggregation of such processes or components. Rather, implementation of an embodiment using processes and components described in this exemplary computing environment will involve programming or configuration of such processes and components resulting in a machine specially programmed or configured for such implementation. The exemplary computing environment described herein is only one example of such an environment and other configurations of the components and processes are possible, including other relationships between and among components, and/or absence of some processes or components described. Further, the exemplary computing environment described herein is not intended to suggest any limitation as to the scope of use or functionality of any embodiment implemented, in whole or in part, on components or processes described herein.

The exemplary computing environment described herein comprises a computing device 10 (further comprising a system bus 11, one or more processors 20, a system memory 30, one or more interfaces 40, one or more non-volatile data storage devices 50), external peripherals and accessories 60, external communication devices 70, remote computing devices 80, and cloud-based services 90.

System bus 11 couples the various system components, coordinating operation of and data transmission between those various system components. System bus 11 represents one or more of any type or combination of types of wired or wireless bus structures including, but not limited to, memory busses or memory controllers, point-to-point connections, switching fabrics, peripheral busses, accelerated graphics ports, and local busses using any of a variety of bus architectures. By way of example, such architectures include, but are not limited to, Industry Standard Architecture (ISA) busses, Micro Channel Architecture (MCA) busses, Enhanced ISA (EISA) busses, Video Electronics Standards Association (VESA) local busses, a Peripheral Component Interconnects (PCI) busses also known as a Mezzanine busses, or any selection of, or combination of, such busses. Depending on the specific physical implementation, one or more of the processors 20, system memory 30 and other components of the computing device 10 can be physically co-located or integrated into a single physical component, such as on a single chip. In such a case, some or all of system bus 11 can be electrical pathways within a single chip structure.

Computing device may further comprise externally-accessible data input and storage devices 12 such as compact disc read-only memory (CD-ROM) drives, digital versatile discs (DVD), or other optical disc storage for reading and/or writing optical discs 62; magnetic cassettes, magnetic tape, magnetic disk storage, or other magnetic storage devices; or any other medium which can be used to store the desired content and which can be accessed by the computing device 10. Computing device may further comprise externally-accessible data ports or connections 12 such as serial ports, parallel ports, universal serial bus (USB) ports, and infrared ports and/or transmitter/receivers. Computing device may further comprise hardware for wireless communication with external devices such as IEEE 1394 ("Firewire") interfaces, IEEE 802.11 wireless interfaces, BLUETOOTH® wireless interfaces, and so forth. Such ports and interfaces may be used to connect any number of external peripherals and accessories 60 such as visual displays, monitors, and touch-sensitive screens 61, USB solid state memory data storage drives (commonly known as "flash drives" or "thumb drives") 63, printers 64, pointers and manipulators such as mice 65, keyboards 66, and other devices 67 such as joysticks and gaming pads, touchpads, additional displays and monitors, and external hard drives (whether solid state or disc-based), microphones, speakers, cameras, and optical scanners.

Processors 20 are logic circuitry capable of receiving programming instructions and processing (or executing)

those instructions to perform computer operations such as retrieving data, storing data, and performing mathematical calculations. Processors 20 are not limited by the materials from which they are formed or the processing mechanisms employed therein, but are typically comprised of semiconductor materials into which many transistors are formed together into logic gates on a chip (i.e., an integrated circuit or IC). The term processor includes any device capable of receiving and processing instructions including, but not limited to, processors operating on the basis of quantum computing, optical computing, mechanical computing (e.g., using nanotechnology entities to transfer data), and so forth. Depending on configuration, computing device 10 may comprise more than one processor. For example, computing device 10 may comprise one or more central processing units (CPUs) 21, each of which itself has multiple processors or multiple processing cores, each capable of independently or semi-independently processing programming instructions. Further, computing device 10 may comprise one or more specialized processors such as a graphics processing unit (GPU) 22 configured to accelerate processing of computer graphics and images via a large array of specialized processing cores arranged in parallel.

System memory 30 is processor-accessible data storage in the form of volatile and/or nonvolatile memory. System memory 30 may be either or both of two types: non-volatile memory and volatile memory. Non-volatile memory 30a is not erased when power to the memory is removed, and includes memory types such as read only memory (ROM), electronically-erasable programmable memory (EEPROM), and rewritable solid state memory (commonly known as "flash memory"). Non-volatile memory 30a is typically used for long-term storage of a basic input/output system (BIOS) 31, containing the basic instructions, typically loaded during computer startup, for transfer of information between components within computing device, or a unified extensible firmware interface (UEFI), which is a modern replacement for BIOS that supports larger hard drives, faster boot times, more security features, and provides native support for graphics and mouse cursors. Non-volatile memory 30a may also be used to store firmware comprising a complete operating system 35 and applications 36 for operating computer-controlled devices. The firmware approach is often used for purpose-specific computer-controlled devices such as appliances and Internet-of-Things (IoT) devices where processing power and data storage space is limited. Volatile memory 30b is erased when power to the memory is removed and is typically used for short-term storage of data for processing. Volatile memory 30b includes memory types such as random-access memory (RAM), and is normally the primary operating memory into which the operating system 35, applications 36, program modules 37, and application data 38 are loaded for execution by processors 20. Volatile memory 30b is generally faster than non-volatile memory 30a due to its electrical characteristics and is directly accessible to processors 20 for processing of instructions and data storage and retrieval. Volatile memory 30b may comprise one or more smaller cache memories which operate at a higher clock speed and are typically placed on the same IC as the processors to improve performance.

Interfaces 40 may include, but are not limited to, storage media interfaces 41, network interfaces 42, display interfaces 43, and input/output interfaces 44. Storage media interface 41 provides the necessary hardware interface for loading data from non-volatile data storage devices 50 into system memory 30 and storage data from system memory 30 to non-volatile data storage device 50. Network interface 42 provides the necessary hardware interface for computing device 10 to communicate with remote computing devices 80 and cloud-based services 90 via one or more external communication devices 70. Display interface 43 allows for connection of displays 61, monitors, touchscreens, and other visual input/output devices. Display interface 43 may include a graphics card for processing graphics-intensive calculations and for handling demanding display requirements. Typically, a graphics card includes a graphics processing unit (GPU) and video RAM (VRAM) to accelerate display of graphics. One or more input/output (I/O) interfaces 44 provide the necessary support for communications between computing device 10 and any external peripherals and accessories 60. For wireless communications, the necessary radio-frequency hardware and firmware may be connected to I/O interface 44 or may be integrated into I/O interface 44.

Non-volatile data storage devices 50 are typically used for long-term storage of data. Data on non-volatile data storage devices 50 is not erased when power to the non-volatile data storage devices 50 is removed. Non-volatile data storage devices 50 may be implemented using any technology for non-volatile storage of content including, but not limited to, CD-ROM drives, digital versatile discs (DVD), or other optical disc storage; magnetic cassettes, magnetic tape, magnetic disc storage, or other magnetic storage devices; solid state memory technologies such as EEPROM or flash memory; or other memory technology or any other medium which can be used to store data without requiring power to retain the data after it is written. Non-volatile data storage devices 50 may be non-removable from computing device 10 as in the case of internal hard drives, removable from computing device 10 as in the case of external USB hard drives, or a combination thereof, but computing device will typically comprise one or more internal, non-removable hard drives using either magnetic disc or solid state memory technology. Non-volatile data storage devices 50 may store any type of data including, but not limited to, an operating system 51 for providing low-level and mid-level functionality of computing device 10, applications 52 for providing high-level functionality of computing device 10, program modules 53 such as containerized programs or applications, or other modular content or modular programming, application data 54, and databases 55 such as relational databases, non-relational databases, object oriented databases, BOSQL databases, and graph databases.

Applications (also known as computer software or software applications) are sets of programming instructions designed to perform specific tasks or provide specific functionality on a computer or other computing devices. Applications are typically written in high-level programming languages such as C++, Java, and Python, which are then either interpreted at runtime or compiled into low-level, binary, processor-executable instructions operable on processors 20. Applications may be containerized so that they can be run on any computer hardware running any known operating system. Containerization of computer software is a method of packaging and deploying applications along with their operating system dependencies into self-contained, isolated units known as containers. Containers provide a lightweight and consistent runtime environment that allows applications to run reliably across different computing environments, such as development, testing, and production systems.

The memories and non-volatile data storage devices described herein do not include communication media. Communication media are means of transmission of information such as modulated electromagnetic waves or modulated data signals configured to transmit, not store, information. By way of example, and not limitation, communication media includes wired communications such as sound signals transmitted to a speaker via a speaker wire, and wireless communications such as acoustic waves, radio frequency (RF) transmissions, infrared emissions, and other wireless media.

External communication devices 70 are devices that facilitate communications between computing device and either remote computing devices 80, or cloud-based services 90, or both. External communication devices 70 include, but are not limited to, data modems 71 which facilitate data transmission between computing device and the Internet 75 via a common carrier such as a telephone company or internet service provider (ISP), routers 72 which facilitate data transmission between computing device and other devices, and switches 73 which provide direct data communications between devices on a network. Here, modem 71 is shown connecting computing device 10 to both remote computing devices 80 and cloud-based services 90 via the Internet 75. While modem 71, router 72, and switch 73 are shown here as being connected to network interface 42, many different network configurations using external communication devices 70 are possible.

Using external communication devices 70, networks may be configured as local area networks (LANs) for a single location, building, or campus, wide area networks (WANs) comprising data networks that extend over a larger geographical area, and virtual private networks (VPNs) which can be of any size but connect computers via encrypted communications over public networks such as the Internet 75. As just one exemplary network configuration, network interface 42 may be connected to switch 73 which is connected to router 72 which is connected to modem 71 which provides access for computing device 10 to the Internet 75. Further, any combination of wired 77 or wireless 76 communications between and among computing device 10, external communication devices 70, remote computing devices 80, and cloud-based services 90 may be used. Remote computing devices 80, for example, may communicate with computing device through a variety of communication channels 74 such as through switch 73 via a wired 77 connection, through router 72 via a wireless connection 76, or through modem 71 via the Internet 75. Furthermore, while not shown here, other hardware that is specifically designed for servers may be employed. For example, secure socket layer (SSL) acceleration cards can be used to offload SSL encryption computations, and transmission control protocol/internet protocol (TCP/IP) offload hardware and/or packet classifiers on network interfaces 42 may be installed and used at server devices.

In a networked environment, certain components of computing device 10 may be fully or partially implemented on remote computing devices 80 or cloud-based services 90. Data stored in non-volatile data storage device 50 may be received from, shared with, duplicated on, or offloaded to a non-volatile data storage device on one or more remote computing devices 80 or in a cloud computing service 92. Processing by processors 20 may be received from, shared with, duplicated on, or offloaded to processors of one or more remote computing devices 80 or in a distributed computing service 93. By way of example, data may reside on a cloud computing service 92, but may be usable or otherwise accessible for use by computing device 10. Also, certain processing subtasks may be sent to a microservice 91 for processing with the result being transmitted to computing device 10 for incorporation into a larger processing task. Also, while components and processes of the exemplary computing environment are illustrated herein as discrete units (e.g., OS 51 being stored on non-volatile data storage device 51 and loaded into system memory 35 for use) such processes and components may reside or be processed at various times in different components of computing device 10, remote computing devices 80, and/or cloud-based services 90.

In an implementation, the disclosed systems and methods may utilize, at least in part, containerization techniques to execute one or more processes and/or steps disclosed herein. Containerization is a lightweight and efficient virtualization technique that allows you to package and run applications and their dependencies in isolated environments called containers. One of the most popular containerization platforms is Docker, which is widely used in software development and deployment. Containerization, particularly with open-source technologies like Docker and container orchestration systems like Kubernetes, is a common approach for deploying and managing applications. Containers are created from images, which are lightweight, standalone, and executable packages that include application code, libraries, dependencies, and runtime. Images are often built from a Dockerfile or similar, which contains instructions for assembling the image. Dockerfiles are configuration files that specify how to build a Docker image. Systems like Kubernetes also support containered or CRI-O. They include commands for installing dependencies, copying files, setting environment variables, and defining runtime configurations. Docker images are stored in repositories, which can be public or private. Docker Hub is an exemplary public registry, and organizations often set up private registries for security and version control using tools such as Hub, JFrog Artifactory and Bintray, Github Packages or Container registries. Containers can communicate with each other and the external world through networking. Docker provides a bridge network by default, but can be used with custom networks. Containers within the same network can communicate using container names or IP addresses.

Remote computing devices 80 are any computing devices not part of computing device 10. Remote computing devices 80 include, but are not limited to, personal computers, server computers, thin clients, thick clients, personal digital assistants (PDAs), mobile telephones, watches, tablet computers, laptop computers, multiprocessor systems, microprocessor based systems, set-top boxes, programmable consumer electronics, video game machines, game consoles, portable or handheld gaming units, network terminals, desktop personal computers (PCs), minicomputers, main frame computers, network nodes, virtual reality or augmented reality devices and wearables, and distributed or multi-processing computing environments. While remote computing devices 80 are shown for clarity as being separate from cloud-based services 90, cloud-based services 90 are implemented on collections of networked remote computing devices 80.

Cloud-based services 90 are Internet-accessible services implemented on collections of networked remote computing devices 80. Cloud-based services are typically accessed via application programming interfaces (APIs) which are software interfaces which provide access to computing services within the cloud-based service via API calls, which are pre-defined protocols for requesting a computing service and receiving the results of that computing service. While cloud-based services may comprise any type of computer processing or storage, three common categories of cloud-based services 90 are microservices 91, cloud computing services 92, and distributed computing services 93.

Microservices 91 are collections of small, loosely coupled, and independently deployable computing services. Each microservice represents a specific computing functionality and runs as a separate process or container. Microservices promote the decomposition of complex applications into smaller, manageable services that can be developed, deployed, and scaled independently. These services communicate with each other through well-defined application programming interfaces (APIs), typically using lightweight protocols like HTTP, gRPC, or message queues such as Kafka. Microservices 91 can be combined to perform more complex processing tasks.

Cloud computing services 92 are delivery of computing resources and services over the Internet 75 from a remote location. Cloud computing services 92 provide additional computer hardware and storage on as-needed or subscription basis. Cloud computing services 92 can provide large amounts of scalable data storage, access to sophisticated software and powerful server-based processing, or entire computing infrastructures and platforms. For example, cloud computing services can provide virtualized computing resources such as virtual machines, storage, and networks, platforms for developing, running, and managing applications without the complexity of infrastructure management, and complete software applications over the Internet on a subscription basis.

Distributed computing services 93 provide large-scale processing using multiple interconnected computers or nodes to solve computational problems or perform tasks collectively. In distributed computing, the processing and storage capabilities of multiple machines are leveraged to work together as a unified system. Distributed computing services are designed to address problems that cannot be efficiently solved by a single computer or that require large-scale computational power. These services enable parallel processing, fault tolerance, and scalability by distributing tasks across multiple nodes.

Although described above as a physical device, computing device 10 can be a virtual computing device, in which case the functionality of the physical components herein described, such as processors 20, system memory 30, network interfaces 40, and other like components can be provided by computer-executable instructions. Such computer-executable instructions can execute on a single physical computing device, or can be distributed across multiple physical computing devices, including being distributed across multiple physical computing devices in a dynamic manner such that the specific, physical computing devices hosting such computer-executable instructions can dynamically change over time depending upon need and availability. In the situation where computing device 10 is a virtualized device, the underlying physical computing devices hosting such a virtualized computing device can, themselves, comprise physical components analogous to those described above, and operating in a like manner. Furthermore, virtual computing devices can be utilized in multiple layers with one virtual computing device executing within the construct of another virtual computing device. Thus, computing device 10 may be either a physical computing device or a virtualized computing device within which computer-executable instructions can be executed in a manner consistent with their execution by a physical computing device. Similarly, terms referring to physical components of the computing device, as utilized herein, mean either those physical components or virtualizations thereof performing the same or equivalent functions. The skilled person will be aware of a range of possible modifications of the various aspects described above. Accordingly, the present invention is defined by the claims and their equivalents.

Computer Program Listing Appendix

Sample Python Code for a Multi-Level Autoencoder with Correlation Network

```
import torch
import torch.nn as nn
class MultiLevelAutoencoder(nn.Module):
    def __init__(self, input_shape):
        super(MultiLevelAutoencoder, self).__init__()
        # Define the multi-level autoencoder architecture
        self.encoder = nn.Sequential(
            # Encoder layers
            nn.Conv2d(input_shape[0], 64, kernel_size=3, padding=1),
            nn.ReLU(inplace=True),
            nn.MaxPool2d(kernel_size=2, stride=2),
            # Add more encoder layers as needed
        )
        self.decoder = nn.Sequential(
            # Decoder layers
            nn.ConvTranspose2d(64, input_shape[0], kernel_size=3, padding=1),
            nn.ReLU(inplace=True),
            nn.Upsample(scale_factor=2, mode='bilinear', align_corners=True),
            # Add more decoder layers as needed
        )
    def forward(self, x):
        compressed = self.encoder(x)
        reconstructed = self.decoder(compressed)
        return compressed, reconstructed
class CorrelationNetwork(nn.Module):
    def __init__(self, input_shape):
        super(CorrelationNetwork, self).__init__()
        # Define the correlation network architecture
        self.layers = nn.Sequential(
            nn.Conv2d(input_shape[0], 64, kernel_size=3, padding=1),
            nn.ReLU(inplace=True),
            nn.Conv2d(64, 64, kernel_size=3, padding=1),
```

```
            nn.ReLU(inplace=True),
            nn.Conv2d(64, input_shape[0], kernel_size=3, padding=1),
            # Add more layers as needed
        )
    def forward(self, x):
        return self.layers(x)
# Create instances of the models
input_shape = (3, 256, 256) # Assumes input images have 3 channels and size 256x256
autoencoder = MultiLevelAutoencoder(input_shape)
correlation_net = CorrelationNetwork(input_shape)
# Define loss functions and optimizers
criterion = nn.MSELoss( )
optimizer_ae = torch.optim.Adam(autoencoder.parameters( ), lr=0.001)
optimizer_corr = torch.optim.Adam(correlation_net.parameters( ), lr=0.001)
# Training loop
for epoch in range(num_epochs):
    for batch in dataloader:
        # Forward pass through the autoencoder
        compressed, reconstructed = autoencoder(batch)
        # Calculate reconstruction loss
        loss_ae = criterion(reconstructed, batch)
        # Forward pass through the correlation network
        restored = correlation_net(compressed)
        # Calculate restoration loss
        loss_corr = criterion(restored, batch)
        # Backward pass and optimization
        optimizer_ae.zero_grad( )
        loss_ae.backward( )
        optimizer_ae.step( )
        optimizer_corr.zero_grad( )
        loss_corr.backward( )
        optimizer_corr.step( )
# Inference
with torch.no_grad( ):
    compressed, _ = autoencoder(input_image)
    restored = correlation_net(compressed)
```

What is claimed is:

1. A system for compressing and restoring data, comprising:
   a computing device comprising at least a memory and a processor;
   a plurality of programming instructions stored in the memory and operable on the processor that, when operating on the processor, cause the computing device to:
   preprocess raw data to generate a plurality of input data sets;
   compress the plurality of input data sets into a plurality of compressed data sets using an encoder within a multi-layer autoencoder;
   decompress the plurality of compressed data sets using a decoder located within a multi-layer autoencoder to obtain a plurality of reduced output data sets; and
   process the plurality of reduced output data sets through a correlation network to recover information lost in compression by leveraging correlations between the plurality of input data sets, thereby generating a plurality of restored output data sets.

2. The system of claim 1, wherein the multi-level autoencoder comprises an encoder and a decoder, and the encoder comprises convolutional layers, pooling layers, and activation functions.

3. The system of claim 1, wherein the correlation network comprises convolutional layers and activation functions.

4. The system of claim 1, wherein the plurality of data sets comprises a plurality of IoT sensor data where the incoming IoT sensor data is organized by sensor type prior to preprocessing.

5. The system of claim 1, wherein the plurality of data sets comprises hyperspectral data.

6. A method for compressing and restoring data, comprising the steps of:
   preprocessing raw data to generate a plurality of input data sets;
   compressing the plurality of input data sets into a plurality of compressed data sets using an encoder within a multi-layer autoencoder;
   decompressing the plurality of compressed data sets using a decoder located within a multi-layer autoencoder to obtain a plurality of reduced output data sets; and
   processing the plurality of reduced output data sets through a correlation network to recover information lost in compression by leveraging correlations between the plurality of input data sets, thereby generating a plurality of restored output data sets.

7. The method of claim 6, wherein the multi-level autoencoder comprises an encoder-decoder architecture with convolutional layers, pooling layers, and activation functions.

8. The method of claim 6, wherein the correlation network comprises an architecture with convolutional layers and activation functions.

9. The method of claim 6, wherein the plurality of data sets comprises a plurality of IoT sensor data where the incoming IoT sensor data is organized by sensor type prior to preprocessing.

10. The method of claim 6, wherein the plurality of data sets comprises hyperspectral data.

* * * * *